United States Patent
Frayer et al.

(10) Patent No.: US 9,048,876 B2
(45) Date of Patent: Jun. 2, 2015

(54) SYSTEMS, METHODS AND DEVICES FOR MULTI-TIERED ERROR CORRECTION

(71) Applicant: SanDisk Enterprise IP LLC, Milpitas, CA (US)

(72) Inventors: Jack Edward Frayer, Boulder Creek, CA (US); Aaron K. Olbrich, Morgan Hill, CA (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 0 days.

(21) Appl. No.: 13/679,963

(22) Filed: Nov. 16, 2012

(65) Prior Publication Data
US 2013/0145229 A1    Jun. 6, 2013

Related U.S. Application Data

(60) Provisional application No. 61/561,804, filed on Nov. 18, 2011.

(51) Int. Cl.
H03M 13/00    (2006.01)
H03M 13/29    (2006.01)
G06F 11/10    (2006.01)

(52) U.S. Cl.
CPC ....... H03M 13/2903 (2013.01); G06F 11/1012 (2013.01)
USPC ............................ 714/776; 714/763; 714/780

(58) Field of Classification Search
CPC .... H04L 1/0057; H04L 1/0061; H04L 1/0041
USPC ............................ 714/776, 763, 755, 780, 752
See application file for complete search history.

(56) References Cited

U.S. PATENT DOCUMENTS

| 4,916,652 A | 4/1990 | Schwarz et al. |
| 5,519,847 A | 5/1996 | Fandrich et al. |

(Continued)

FOREIGN PATENT DOCUMENTS

| EP | 1465203 A1 | 10/2004 |
| EP | 1 990 921 A2 | 11/2008 |

(Continued)

OTHER PUBLICATIONS

Sandisk Enterprise IP LLC, International Search Report / Written Opinion, PCT/US2012/042771, Mar. 4, 2013, 14 pgs.

(Continued)

*Primary Examiner* — Fritz Alphonse
(74) *Attorney, Agent, or Firm* — Morgan, Lewis & Bockius LLP

(57) ABSTRACT

An error control encoding system produces a codeword from a data word, where the resulting codeword includes the data word and three or more parity segments produced using the data word. The system includes a first encoder to encode the data word in two or more first data segments in order to produce two or more first parity segments, where each of the two or more first data segments includes a respective sequential portion of the data word. The system includes a second encoder to encode the data word in one or more second data segments in order to produce a corresponding one or more second parity segments, where each of the one or more second data segments includes a respective sequential portion of the data word, and each of the one or more second data segments also includes a sequential portion of the data included in a plurality of the two or more first data segments. Further, the system includes a controller configured to provide the two or more first data segments of the data word to the first encoder for encoding and to provide the one or more second data segments of the data word to the second encoder for encoding.

29 Claims, 13 Drawing Sheets

Data Storage Environment 100

(56) References Cited

U.S. PATENT DOCUMENTS

| | | | |
|---|---|---|---|
| 5,530,705 A | 6/1996 | Malone, Sr. | |
| 5,537,555 A | 7/1996 | Landry et al. | |
| 5,551,003 A | 8/1996 | Mattson et al. | |
| 5,657,332 A | 8/1997 | Auclair et al. | |
| 5,666,114 A | 9/1997 | Brodie et al. | |
| 5,708,849 A | 1/1998 | Coke et al. | |
| 5,943,692 A | 8/1999 | Marberg et al. | |
| 5,982,664 A | 11/1999 | Watanabe | |
| 6,000,006 A | 12/1999 | Bruce et al. | |
| 6,016,560 A | 1/2000 | Wada et al. | |
| 6,018,304 A * | 1/2000 | Bessios | 341/58 |
| 6,070,074 A * | 5/2000 | Perahia et al. | 455/430 |
| 6,138,261 A * | 10/2000 | Wilcoxson et al. | 714/755 |
| 6,182,264 B1 | 1/2001 | Ott | |
| 6,192,092 B1 * | 2/2001 | Dizon et al. | 375/371 |
| 6,295,592 B1 | 9/2001 | Jeddeloh | |
| 6,311,263 B1 | 10/2001 | Barlow et al. | |
| 6,442,076 B1 | 8/2002 | Roohparvar | |
| 6,449,625 B1 | 9/2002 | Wang | |
| 6,484,224 B1 | 11/2002 | Robins et al. | |
| 6,516,437 B1 | 2/2003 | Van Stralen et al. | |
| 6,678,788 B1 | 1/2004 | O'Connell | |
| 6,757,768 B1 | 6/2004 | Potter et al. | |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,871,257 B2 | 3/2005 | Conley et al. | |
| 6,895,464 B2 | 5/2005 | Chow et al. | |
| 6,978,343 B1 | 12/2005 | Ichiriu | |
| 6,980,985 B1 | 12/2005 | Amer-Yahia et al. | |
| 6,981,205 B2 | 12/2005 | Fukushima et al. | |
| 6,988,171 B2 | 1/2006 | Beardsley et al. | |
| 7,020,017 B2 | 3/2006 | Chen et al. | |
| 7,032,123 B2 | 4/2006 | Kane et al. | |
| 7,043,505 B1 | 5/2006 | Teague et al. | |
| 7,100,002 B2 | 8/2006 | Shrader et al. | |
| 7,111,293 B1 | 9/2006 | Hersh et al. | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,328,377 B1 | 2/2008 | Lewis et al. | |
| 7,516,292 B2 | 4/2009 | Kimura et al. | |
| 7,523,157 B2 | 4/2009 | Aguilar, Jr. et al. | |
| 7,527,466 B2 | 5/2009 | Simmons | |
| 7,529,466 B2 | 5/2009 | Takahashi | |
| 7,571,277 B2 | 8/2009 | Mizushima | |
| 7,574,554 B2 | 8/2009 | Tanaka et al. | |
| 7,596,643 B2 | 9/2009 | Merry, Jr. et al. | |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,761,655 B2 | 7/2010 | Mizushima et al. | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,954,041 B2 | 5/2011 | Hong et al. | |
| 7,971,112 B2 | 6/2011 | Murata | |
| 7,974,368 B2 | 7/2011 | Shieh et al. | |
| 7,978,516 B2 | 7/2011 | Olbrich et al. | |
| 7,996,642 B1 | 8/2011 | Smith | |
| 8,006,161 B2 | 8/2011 | Lestable et al. | |
| 8,032,724 B1 | 10/2011 | Smith | |
| 8,069,390 B2 | 11/2011 | Lin | |
| 8,190,967 B2 | 5/2012 | Hong et al. | |
| 8,254,181 B2 | 8/2012 | Hwang et al. | |
| 8,312,349 B2 | 11/2012 | Reche et al. | |
| 8,412,985 B1 | 4/2013 | Bowers et al. | |
| 2002/0024846 A1 | 2/2002 | Kawahara et al. | |
| 2002/0083299 A1 | 6/2002 | Van Huben et al. | |
| 2002/0152305 A1 | 10/2002 | Jackson et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid et al. | |
| 2003/0088805 A1 | 5/2003 | Majni et al. | |
| 2003/0093628 A1 | 5/2003 | Matter et al. | |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0212719 A1 | 11/2003 | Yasuda et al. | |
| 2004/0024957 A1 | 2/2004 | Lin et al. | |
| 2004/0024963 A1 | 2/2004 | Talagala et al. | |
| 2004/0073829 A1 | 4/2004 | Olarig | |
| 2004/0153902 A1 | 8/2004 | Machado et al. | |
| 2004/0181734 A1 | 9/2004 | Saliba | |
| 2004/0199714 A1 | 10/2004 | Estakhri et al. | |
| 2004/0237018 A1 | 11/2004 | Riley | |
| 2005/0060456 A1 | 3/2005 | Shrader et al. | |
| 2005/0060501 A1 | 3/2005 | Shrader | |
| 2005/0114587 A1 | 5/2005 | Chou et al. | |
| 2005/0172065 A1 | 8/2005 | Keays | |
| 2005/0172207 A1 | 8/2005 | Radke et al. | |
| 2005/0193161 A1 | 9/2005 | Lee et al. | |
| 2005/0201148 A1 | 9/2005 | Chen et al. | |
| 2005/0231765 A1 | 10/2005 | So et al. | |
| 2005/0257120 A1 | 11/2005 | Gorobets et al. | |
| 2005/0273560 A1 | 12/2005 | Hulbert et al. | |
| 2005/0289314 A1 | 12/2005 | Adusumilli et al. | |
| 2006/0039196 A1 | 2/2006 | Gorobets et al. | |
| 2006/0053246 A1 | 3/2006 | Lee | |
| 2006/0085671 A1 | 4/2006 | Majni et al. | |
| 2006/0136570 A1 | 6/2006 | Pandya | |
| 2006/0156177 A1 | 7/2006 | Kottapalli et al. | |
| 2006/0195650 A1 | 8/2006 | Su et al. | |
| 2006/0259528 A1 | 11/2006 | Dussud et al. | |
| 2007/0011413 A1 | 1/2007 | Nonaka et al. | |
| 2007/0058446 A1 | 3/2007 | Hwang et al. | |
| 2007/0061597 A1 | 3/2007 | Holtzman et al. | |
| 2007/0076479 A1 | 4/2007 | Kim et al. | |
| 2007/0081408 A1 | 4/2007 | Kwon et al. | |
| 2007/0083697 A1 | 4/2007 | Birrell et al. | |
| 2007/0113019 A1 | 5/2007 | Beukema et al. | |
| 2007/0133312 A1 | 6/2007 | Roohparvar | |
| 2007/0147113 A1 | 6/2007 | Mokhlesi et al. | |
| 2007/0150790 A1 | 6/2007 | Gross et al. | |
| 2007/0157064 A1 | 7/2007 | Falik et al. | |
| 2007/0174579 A1 | 7/2007 | Shin | |
| 2007/0180188 A1 | 8/2007 | Fujibayashi et al. | |
| 2007/0208901 A1 | 9/2007 | Purcell et al. | |
| 2007/0234143 A1 | 10/2007 | Kim | |
| 2007/0245061 A1 | 10/2007 | Harriman | |
| 2007/0277036 A1 | 11/2007 | Chamberlain et al. | |
| 2007/0291556 A1 | 12/2007 | Kamei | |
| 2007/0294496 A1 | 12/2007 | Goss et al. | |
| 2007/0300130 A1 | 12/2007 | Gorobets | |
| 2008/0019182 A1 | 1/2008 | Yanagidaira et al. | |
| 2008/0022163 A1 | 1/2008 | Tanaka et al. | |
| 2008/0052446 A1 | 2/2008 | Lasser et al. | |
| 2008/0077841 A1 | 3/2008 | Gonzalez et al. | |
| 2008/0077937 A1 | 3/2008 | Shin et al. | |
| 2008/0086677 A1 | 4/2008 | Yang et al. | |
| 2008/0144371 A1 | 6/2008 | Yeh et al. | |
| 2008/0147964 A1 | 6/2008 | Chow et al. | |
| 2008/0147998 A1 | 6/2008 | Jeong | |
| 2008/0148124 A1 | 6/2008 | Zhang et al. | |
| 2008/0163030 A1 | 7/2008 | Lee | |
| 2008/0168191 A1 | 7/2008 | Biran et al. | |
| 2008/0168319 A1 | 7/2008 | Lee et al. | |
| 2008/0170460 A1 | 7/2008 | Oh et al. | |
| 2008/0229000 A1 | 9/2008 | Kim | |
| 2008/0229003 A1 | 9/2008 | Mizushima et al. | |
| 2008/0229176 A1 | 9/2008 | Arnez et al. | |
| 2008/0270680 A1 | 10/2008 | Chang | |
| 2008/0282128 A1 | 11/2008 | Lee et al. | |
| 2008/0285351 A1 | 11/2008 | Shlick et al. | |
| 2009/0003058 A1 | 1/2009 | Kang | |
| 2009/0037652 A1 | 2/2009 | Yu et al. | |
| 2009/0144598 A1 | 6/2009 | Yoon et al. | |

(56) References Cited

U.S. PATENT DOCUMENTS

| | | |
|---|---|---|
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0296466 A1 | 12/2009 | Kim et al. |
| 2009/0296486 A1 | 12/2009 | Kim et al. |
| 2009/0319864 A1 | 12/2009 | Shrader |
| 2010/0061151 A1 | 3/2010 | Miwa et al. |
| 2010/0103737 A1 | 4/2010 | Park |
| 2010/0161936 A1 | 6/2010 | Royer et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0173378 A1 | 7/2011 | Filor et al. |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2012/0096217 A1 | 4/2012 | Son et al. |
| 2012/0110250 A1 | 5/2012 | Sabbag et al. |
| 2012/0151253 A1 | 6/2012 | Horn |
| 2012/0195126 A1 | 8/2012 | Roohparvar |
| 2012/0239976 A1 | 9/2012 | Cometti et al. |
| 2012/0284587 A1 | 11/2012 | Yu et al. |
| 2014/0136927 A1 | 5/2014 | Li et al. |

FOREIGN PATENT DOCUMENTS

| | | |
|---|---|---|
| JP | 2002-532806 S | 10/2002 |
| WO | WO 2007/036834 A2 | 4/2007 |
| WO | WO 2007/080586 A2 | 7/2007 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |

OTHER PUBLICATIONS

SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
Canim, Buffered Bloom ilters on Solid State Storage, ADMS*10, Singapore, Sep. 13-17, 2010, 8 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
SanDisk Enterprise IP LLC, Notification of the Decision to Grant a Patent Right for Patent for Invention, CN 200880127623.8, Jul. 4, 2013, 1 pg.
Sandisk Enterprise, ISR/WO, PCT/US2012/059459, Feb. 14, 2013, 9 pgs.
SanDisk Enterprise, Office Action, CN 200880127623.8, Dec. 31, 2012, 9 pgs.
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
International Search Report and Written Opinion dated May 14, 2014, received in International Patent Application No. PCT/US2014/017168, which corresponds to U.S. Appl. No. 14/076,115, 6 pages (Fitzpatrick).
International Search Report and Written Opinion dated May 14, 2014, received in International Patent Application No. PCT/US2014/017169, which corresponds to U.S. Appl. No. 14/076,148, 6 pages (Fitzpatrick).
Barr, Introduction to Watchdog Timers, Oct. 2001, 3 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
McLean, Information Technology—AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, ISR/WO, PCT/US08/88133, Mar. 19, 2009, 7 pgs.
Pliant Technology, ISR/WO, PCT/US08/88136, Mar. 19, 2009, 7 pgs.
Pliant Technology, ISR/WO, PCT/US08/88146, Feb. 26, 2009, 10 pgs.
Pliant Technology, ISR/WO, PCT/US08/88154, Feb. 27, 2009, 9 pgs.
Pliant Technology, ISR/WO, PCT/US08/88164, Feb. 13, 2009, 11 pgs.
Pliant Technology, ISR/WO, PCT/US08/88206, Feb. 18, 2009, 8 pgs.
Pliant Technology, ISR/WO, PCT/US08/88217, Feb. 19, 2009, 7 pgs.
Pliant Technology, ISR/WO, PCT/US08/88229, Feb. 13, 2009, 8 pgs.
Pliant Technology, ISR/WO, PCT/US08/88232, Feb. 19, 2009, 8 pgs.
Pliant Technology, ISR/WO, PCT/US08/88236, Feb. 19, 2009, 7 pgs.
Pliant Technology, ISR/WO, PCT/US2011/028637, Oct. 27, 2011, 11 pgs.
Pliant Technology, Supplementary ESR, 08866997.3, Feb. 23, 2012, 6 pgs.
SanDisk Enterprise, ISR/WO, PCT/US2012/042764, Aug. 31, 2012, 12 pgs.
SanDisk Enterprise, ISR/WO, PCT/US2012/042775, Sep. 26, 2012, 8 pgs.
SanDisk Enterprise, Office Action, CN 200880127623.8, Apr. 18, 2012, 12 pgs.
SanDisk Enterprise, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.

* cited by examiner

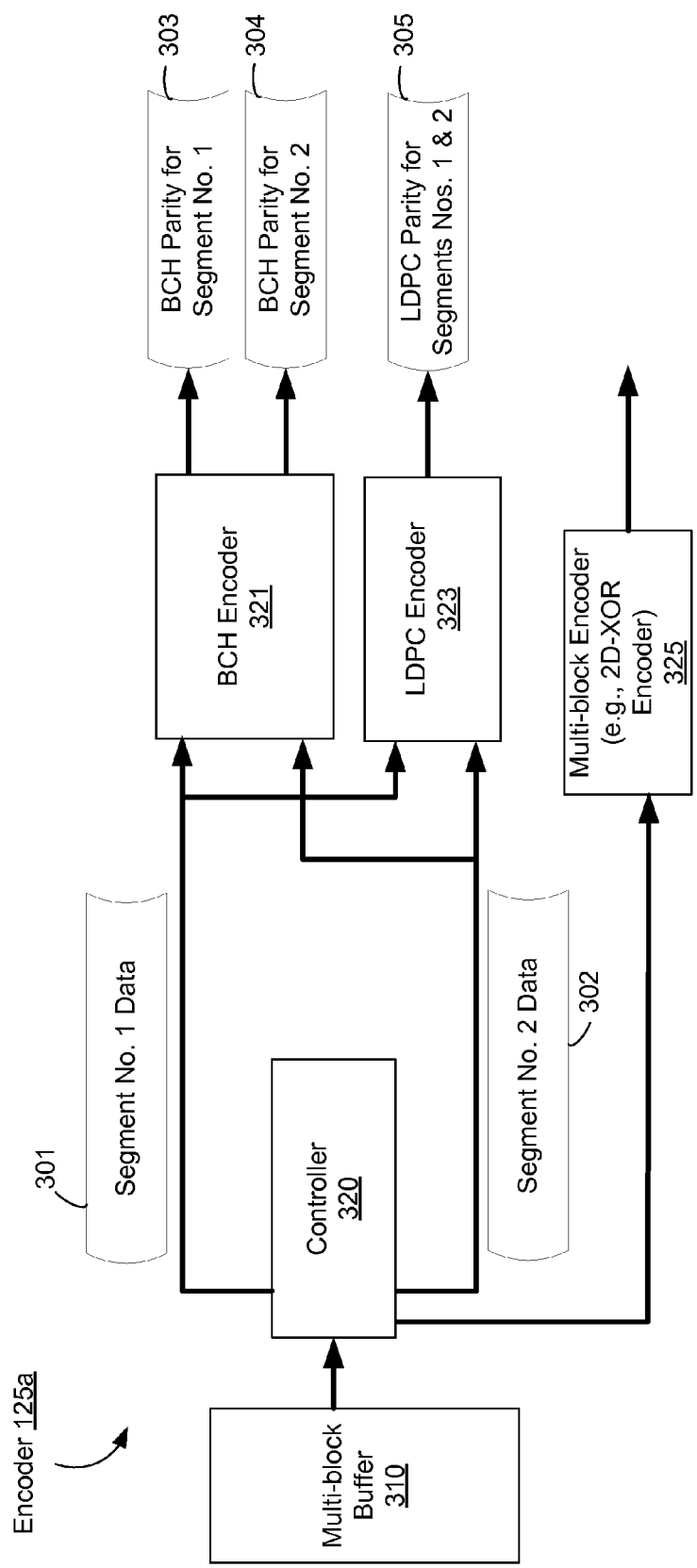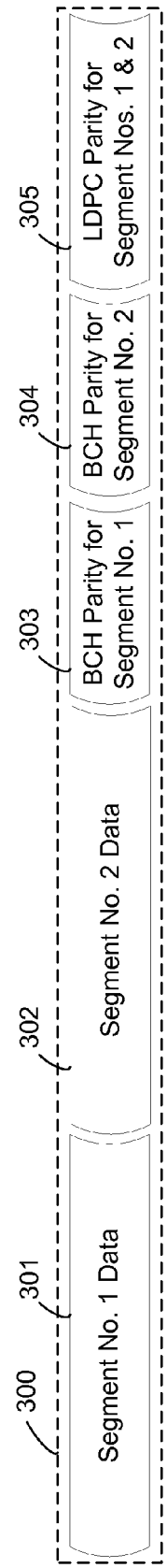
Figure 3A
Figure 3B

SYSTEMS, METHODS AND DEVICES FOR MULTI-TIERED ERROR CORRECTION

RELATED APPLICATIONS

This application claims the benefit of U.S. Provisional Patent Application No. 61/561,804, filed on Nov. 18, 2011, and which is incorporated by reference herein in its entirety.

TECHNICAL FIELD

The present disclosure relates to using error control codes in memory systems, and in particular, to parallel concatenated coding that does not rely on interleaving data.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater storage density, so that specifications such as power consumption and form factor may be maintained and preferably reduced. As such, there is ongoing pressure to increase the storage density of non-volatile memories in order to further improve the useful attributes of such devices. However, a drawback of increasing storage density is that the stored data is increasingly prone to storage and/or reading errors.

Error control coding has been used to limit the increased likelihood of errors in memory systems. One error control coding option is known as concatenated coding. Concatenated coding is particularly promising because the generated codewords may be iteratively decoded, which in turn, may improve the error correction capability of the system. A concatenated coding scheme typically includes two data encoders separated by an interleaver. The interleaver shuffles data so that the two encoders receive the data in different orders from one another. Reciprocally, decoding employs two decoders separated by a de-interleaver that reverses the shuffling of the encoder-side interleaver. The shuffling and reverse-shuffling help to normalize the distribution of errors by de-clustering clustered errors. A normalized error distribution is often desirable because a normalized distribution enables the use of lower complexity codes and/or decoding processes.

However, various challenges, arising from the current reliance on interleaving, have curtailed the utilization of concatenated codes. For example, the complex circuitry needed to implement an interleaver and de-interleaver is generally power intensive and occupies a substantially large die area in monolithic implementations. Moreover, the architecture of a digital storage system that employs interleaving is typically designed to accommodate multi-bit symbol interleaving. For flash memory devices, multi-bit symbol interleaving typically utilizes byte wide channels across multiple ports. If the ports are controlled by independent controllers, the complexity of synchronizing the ports becomes a restriction on system implementation. Additionally, the use of interleaving restricts feeding forward corrected information from one decoder to another when a portion of a codeword is relatively easy to correct. The previously unattainable ability to feed forward corrected information would improve the ability to correct codewords having non-uniform error distributions. So even though concatenated coding may be capable of providing improved error correction capability, the use of concatenated codes that rely on interleaving is somewhat undesirable due to these and other physical constraints.

SUMMARY

Various implementations of systems, methods and devices within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to enable: (i) interleaver-free parallel concatenated encoding and decoding; (ii) using an error estimation module to select which of two or more decoders to use to start a parallel concatenated decoding process; and, (iii) matching the probabilities of bit errors at particular memory locations to the error correction capability of an error correction code.

Some implementations include systems, methods and/or devices enabled to encode and decode data using a parallel concatenated code that does not use interleaving or de-interleaving (i.e., interleaver-free). In particular, such implementations employ joint-iterative decoding of the data encoded by two or more independent and parallel encoders that encode the data in overlapping segments of the data. The joint-iterative decoding process is enabled to feed forward corrected information from one decoder to another to improve the ability to correct codewords having non-uniform error distributions.

Some implementations include systems, methods and/or devices enabled to select one of two or more decoders to use to start a parallel concatenated decoding process, based on an estimate of the number of errors in a codeword. In some implementations, an error control decoding system includes an error estimation module and a controller. The error estimation module estimates the number of errors in a codeword. The controller selects which of a first decoder and a second decoder to use to start decoding the codeword based on an error estimate provided by the error estimation module.

Some implementations include systems, methods and/or devices enabled to match the probabilities of bit errors at particular memory locations to the error correction capability and characteristics of an error correction code. In some implementations, an error control system includes an error tracking module and a code adaptation module. The error tracking module produces error location statistics that are converted into an error density location profile characterizing the storage medium. The code adaptation module produces adjustments for an adjustable generator matrix (used by an encoder) and an adjustable parity-check matrix (used by a decoder) based on the error density location profile. In some implementations, an error density location profile is produced from a device (e.g. product line) characterization process that generates error location statistics of a storage medium representative of the storage medium over the intended life-cycle of the storage medium or a defined portion of the life-cycle of the storage medium. That error density location profile is used to produce an error control code generator matrix and a complementary parity-check matrix that matches the probabilities of bit errors at particular memory (i.e., storage medium) locations to the error correction capability and characteristics of the error correction code defined by the generator matrix and the complementary parity-check matrix.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 3A is a schematic diagram of an implementation of a parallel concatenated code encoder.

FIG. 3B is a diagram of a codeword produced by the encoder of FIG. 3A.

Figure 1:
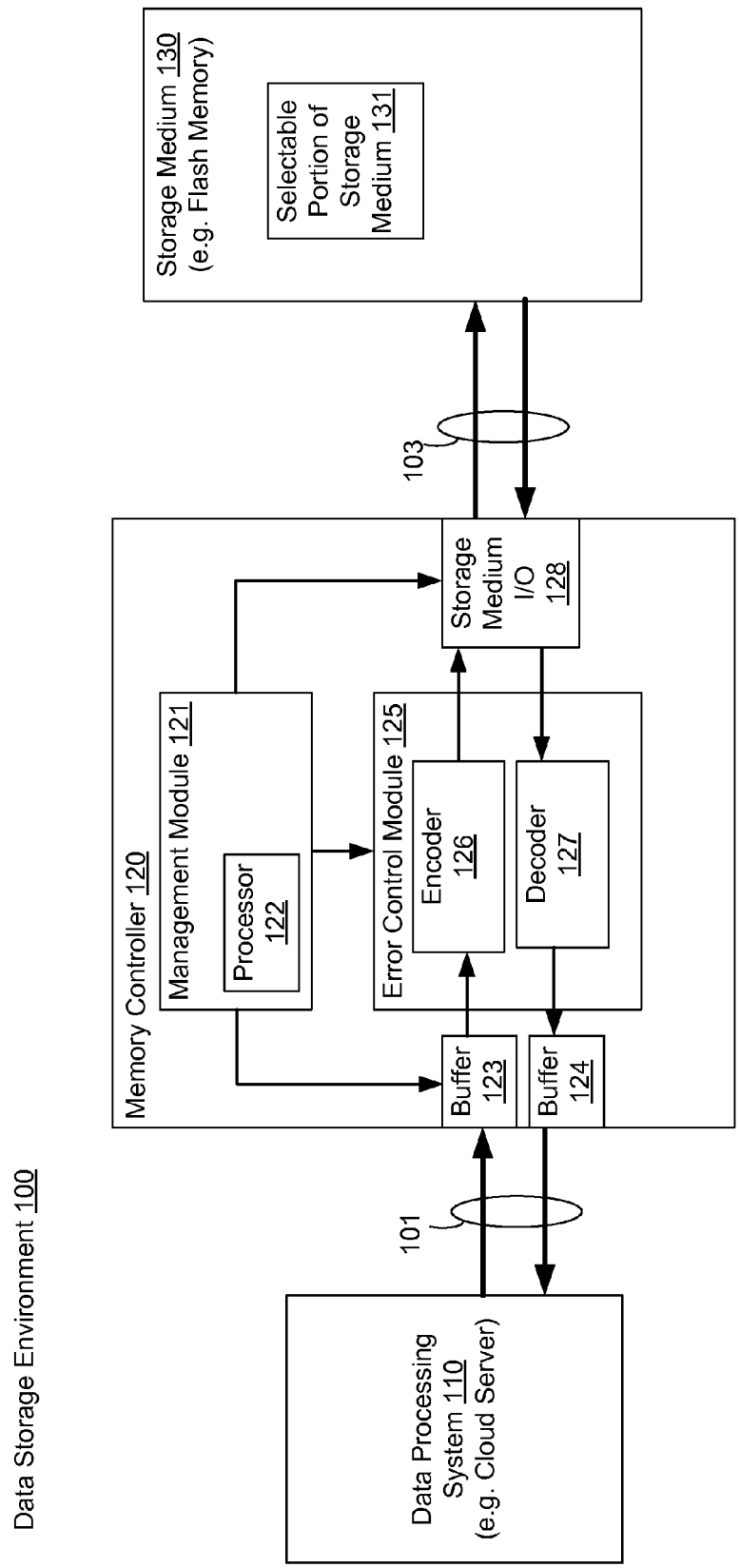
FIG. 1 is a schematic diagram of a data storage environment.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

The various implementations described herein include systems, methods and/or devices that may enhance the performance of error control codes used to improve the reliability with which data can be stored and read in a storage medium, such as a flash memory.

Some implementations include systems, methods and/or devices enabled to encode and decode data using a parallel concatenated code that does not use interleaving or de-interleaving (i.e., interleaver-free). In particular, such implementations employ joint-iterative decoding of the data encoded by two or more independent and parallel encoders. The joint-iterative decoding process is enabled to feed forward corrected information from one decoder to another to improve the ability to correct codewords having non-uniform error distributions. In some implementations, the ability to feed forward corrected information is facilitated by the structure of the codeword generated by two or more parallel encoders. More specifically, in some implementations an error control encoding system is operable to produce a codeword that includes a data word and three or more parity segments produced using the data word. A first encoder encodes the data word as two or more first data segments to produce two or more first parity segments. Each of the two or more first data segments includes a respective sequential portion of the data word. A second encoder encodes the data word as one or more second data segments to produce a corresponding one or more second parity segments. Each of the one or more second data segments includes a respective sequential portion of the data word. Each of the one or more second data segments also includes a sequential portion of the data spanning two or more of the first data segments. In some implementations, a controller provides the two or more first data segments of the data word to the first encoder for encoding, and provides the one or more second data segments of the same data word to the second encoder for encoding.

Some implementations include systems, methods and/or devices enabled to select one of two or more decoders to use to start a parallel concatenated decoding process, based on an estimate of the number of errors in a codeword. In some implementations, an error control decoding system includes an error estimation module and a controller. The error estimation module estimates the number of errors in a codeword. The controller selects which of a first decoder and a second decoder to use to start decoding the codeword, based on the error estimate provided by the error estimation module.

Some implementations include systems, methods and/or devices enabled to match the probabilities of bit errors at particular memory locations to the error correction capability and characteristics of an error correction code. In some implementations, an error control system includes an error tracking module and a code adaptation module. The error tracking module produces error location statistics that are converted into an error density location profile characterizing the storage medium. In some implementations, the code adaptation module produces adjustments for an adjustable generator matrix (used by an encoder) and an adjustable parity-check matrix (used by a decoder) based on the error density location profile. More specifically, error probabilities associated with specific memory locations are integrated into the error control code through the respective matrices to alter the probability of whether a codeword is correctable. In particular, some error control codes are characterized as being irregular because some of the check bits are more interconnected to data bits than others. When a check bit is more interconnected with variable bits (i.e., data or message bits), that check bit will typically flag errors more often. Less interconnected check bits tend to converge faster than the more interconnected check bits, so that information from the less interconnected check bits assists the decoding of the more interconnected check bits. In some implementations, these and other characteristics of irregular error control codes are used to selectively map the physical-performance characteristics of the storage medium to the interconnectivity of the check bits. For example, in some implementations, memory locations with higher probabilities of bit errors are mapped to the more interconnected check bits of the code to allow fast error detection in a low defect environment. In some implementations, memory locations with higher probabilities of bit errors are mapped to the less interconnected check bits of the code to enable relatively faster decoder convergence in a high defect environment.

In some implementations, the error density profile is produced from a device (e.g. product line) characterization process that generates error location statistics of a storage medium representative of the storage medium over the intended life-cycle of the storage medium or a defined portion of the life-cycle of the storage medium. That error density location profile is used to produce an error control code generator matrix and a complementary parity-check matrix that matches the probabilities of bit errors at particular memory (i.e., storage medium) locations to the error correction capability and characteristics of the error correction code defined by the generator matrix and the complementary parity-check matrix. Stated another way, using the error density location profile, an error control code generator matrix and a complementary parity-check matrix are generated that correspond to the error density location profile. Thus, in such implementations, two storage mediums with significantly different error density location profiles will have different error control code generator matrices and different complementary parity-check matrices.

Some implementations include systems, methods and/or devices that utilize a parallel concatenated code structure that does not rely on data interleaving to normalize the distribution of errors. The parallel concatenated coding and decoding system presented herein includes two or more encoders that independently encode a data word as two or more respective sets of data segments. A data segment from one set includes data spanning two or more sequential data segments in another set. Some implementations are suitable for relatively high bit-error-rate (BER) conditions and utilize relatively low complexity hardware, relatively short codewords, and parity overhead similar to other error correction methods. Some implementations improve error correction performance in situations where errors occur in a non-uniform distribution or a distribution that resembles a Poisson distribution—where the average BER is approximately equal to the variance of the BER.

Some implementations include decoding systems with the capability to select which of two or more decoders to use to start a parallel concatenated decoding process based on an estimate of the number of errors in a codeword. In some implementations, an error estimation module includes a decoding-side encoder to facilitate the generation of error estimates.

Some implementations include error control systems with the capability to match the probabilities of bit errors at particular memory locations to the error correction capability of an error correction code, and subsequently adjust the encoding of data based on deterioration and/or fluctuations in the physical nature of a storage medium.

Numerous details are described herein in order to provide a thorough understanding of the example implementations illustrated in the accompanying drawings. However, the invention may be practiced without many of the specific details. And, well-known methods, components, and circuits have not been described in exhaustive detail so as not to unnecessarily obscure more pertinent aspects of the implementations described herein.

FIG. 1 is a diagram of an implementation of a data storage environment, namely data storage environment 100. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, data storage environment 100 includes data processing system 110, memory controller 120, and storage medium 130 (e.g., a flash memory device).

Data processing system 110 is coupled to memory controller 120 through data connections 101. Those skilled in the art will appreciate from the present disclosure that in various implementations data processing system 110 includes memory controller 120 as a component. Generally, data processing system 110 includes any suitable computer device, such as a computer, a laptop computer, a tablet device, a netbook, an internet kiosk, a personal digital assistant, a mobile phone, a smart phone, a gaming device, a computer server, or any other computing device. In some implementations, data processing system 110 includes one or more processors, one or more types of memory, a display and/or other user interface components such as a keyboard, a touch screen display, a mouse, a track-pad, a digital camera and/or any number of supplemental devices to add functionality.

Storage medium 130 is coupled to memory controller 120 through data connections 103. Those skilled in the art will appreciate from the present disclosure that in various implementations memory controller 120 and storage medium 130 are included in the same device as constituent components thereof. Storage medium 130 includes any number (i.e., one or more) of memory devices including, without limitation, non-volatile semiconductor memory devices, such as flash memory. For example, flash memory devices can be configured for enterprise storage suitable for applications such as cloud computing. Additionally and/or alternatively, flash memory devices can also be configured for relatively smaller-scale applications such as personal flash drives or hard-disk replacements for personal, laptop and tablet computers. In some implementations, storage medium 130 comprises one or more flash memory devices. In some implementations, storage medium 130 comprises at least one of NAND-type flash memory and NOR-type flash memory.

Storage mediums are often divided into a number of addressable and individually selectable blocks, such as selectable portion 131. In some implementations, for flash memory, the individually selectable blocks are the minimum erasable units in a flash memory device. In other words, each block contains a minimum number of memory cells that can be erased simultaneously. Each block is usually further divided into a plurality of pages, where each page is typically an instance of a minimum unit of the smallest individually accessible sub-block in the block. However, in some implementations (e.g., in some types of flash memory), the minimum unit of individually accessible data is a sector, which is a subset of a page. That is, each page contains a plurality of sectors and each sector is the minimum unit of individually accessible data for writing data to or reading data from the flash memory device.

For the sake of notation only, a block of data includes a number of pages, which in turns includes a number of sectors. For example, in some implementations, one block includes 64 pages, 128 pages, 256 pages, or another suitable number of pages. The respective sizes of blocks, pages and sectors are often a matter of design choice or end-user choice, and are often differ across a wide range of enterprise and consumer devices. However, for example only, and without limitation, in some enterprise applications a sector includes anywhere from 256 bytes to 544 bytes. That range may be extended upward or downward, and/or shrink or expand depending on a particular application. Moreover, the blocks are typically grouped into a plurality of zones, sometimes called block zones. Each block zone can be independently managed to some extent, which enables parallel operations and simplifies data storage management.

In some implementations, memory controller 120 includes management module 121, input buffer 123, output buffer 124, error control module 125 and storage medium interface (I/O) 128. Those skilled in the art will appreciate from the present disclosure that memory controller 120 includes various additional features that have not been illustrated for the sake of brevity, and so as not to obscure more pertinent features of the example implementations disclosed herein, and that a different arrangement of features may be possible.

Input and output buffers 123,124 provide an interface to data processing system 110 through data connections 101. Similarly, storage medium I/O 128 provides an interface to storage medium 130 though data connections 103. In some implementations, storage medium I/O 128 includes read and write circuitry, including circuitry capable of providing read comparison signal values to the storage medium 130.

In some implementations, management module 121 includes a processor 122. However, those skilled in the art will appreciate from the present disclosure that, in some implementations, processor 122 is shared by one or more components within, and in some cases, beyond the function of memory controller 120. Management module 121 is coupled to input and output buffers 123, 124, error control module 125 and storage medium I/O 128 in order to coordinate the operation of these components.

Error control module 125 is coupled between storage medium I/O 128 and input and output buffers 123, 124. In some implementations, error control module 125 is provided to limit the number of uncorrectable errors inadvertently introduced into data. To that end, error control module 125 includes encoder 126 and decoder 127. Encoder 126 encodes data to produce a codeword which is subsequently stored in storage medium 130. When the encoded data is read from storage medium 130, decoder 127 applies a decoding process to recover the data, and correct errors within the error correcting capability of the error control code. Those skilled in the art will appreciate from the present disclosure that various error control codes have different error detection and correction capacities, and that particular codes are selected for various applications for reasons beyond the scope of this disclosure. As such, an exhaustive review of the various types of error control codes has not been provided for the sake of brevity. Moreover, those skilled in the art will appreciate that each type or family of error control codes may have encoding and decoding algorithms that are particular to the type or family of error control codes. On the other hand some algorithms, such as the Viterbi algorithm, may be utilized at least to some extent in the decoding of a number of different types or families of error control codes. So again, for the sake of brevity, an exhaustive description of the various types of encoding and decoding algorithms generally available and known to those skilled in the art is not provided herein.

During a write operation, input buffer 123 receives data to be stored in storage medium 130 from data processing system 110. Data in input buffer 123 is made available to encoder 126, which encodes the data to produce a codeword. The codeword is made available to storage medium I/O 128, which transfers the codeword to storage medium 130 in a manner dependent on the type of storage medium being utilized. During a read operation for the same data, storage medium I/O 128 accesses the portion of storage medium 130 including the corresponding codeword to read the codeword and provides the codeword to decoder 127. When decoding by decoder 127 is successful, the resulting decoded data is provided to output buffer 124, where the decoded data is made available to data processing system 110. In some implementations, when the decoding is not successful, memory controller 120 reads the codeword from the storage medium again, using different decoding or error correction, as discussed in more detail below.

Error control coding utilizing concatenated codes is particularly promising because the generated codewords can be iteratively decoded. In some implementations, iterative decoding improves the error correction capability of the system, and reduces the number of read operations used to successfully recover correct data from a storage medium. However, as noted above, various challenges, arising from the current reliance on interleaving, have curtailed the utilization of concatenated codes. So even though concatenated coding may be capable of providing improved error correction capability, the use of concatenated codes that rely on interleaving is somewhat undesirable due to these and other physical constraints.

By contrast, various implementations of systems, methods and devices described herein employ parallel concatenated codes that do not use interleaving or de-interleaving. In particular, such implementations employ joint-iterative decoding of the data encoded by two or more independent and parallel encoders. The joint-iterative decoding is free to feed forward corrected information from one decoder to another to improve the ability to correct codewords having non-uniform error distributions. In some implementations, the capability to feed forward corrected information is facilitated by the structure of the codeword generated by two or more parallel encoders.

Figure 2A:
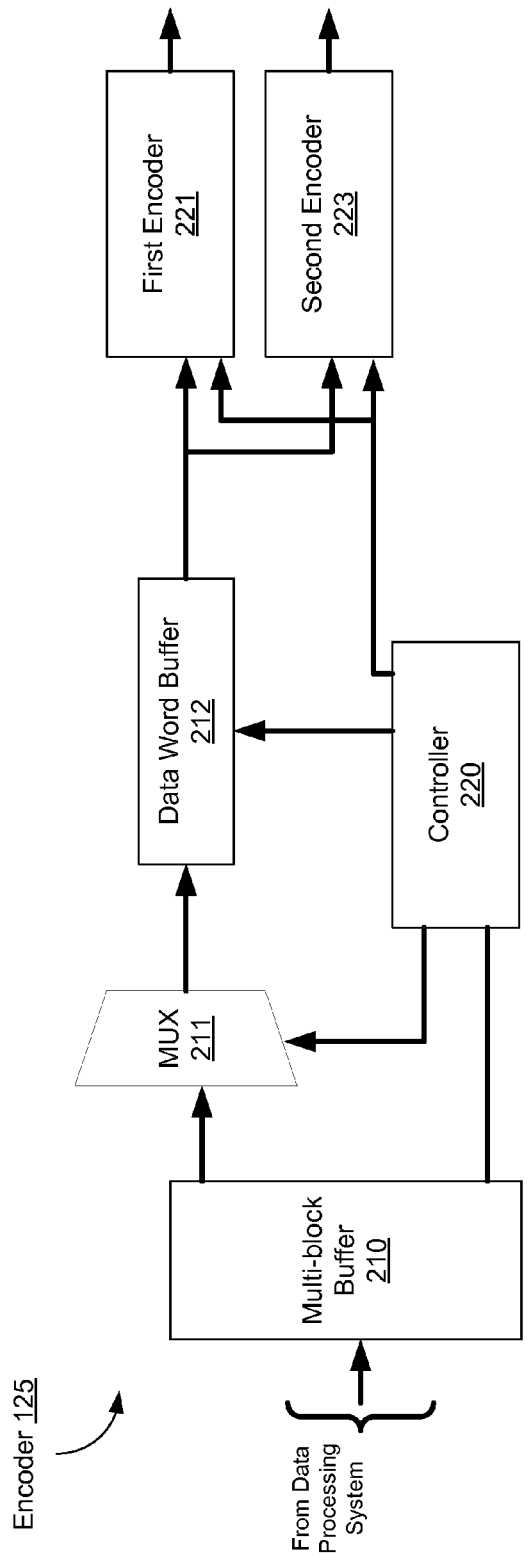
FIG. 2A is a schematic diagram of an implementation of a parallel concatenated code encoder including two constituent encoders.

As an example, FIG. 2A is a schematic diagram of an implementation of a parallel concatenated code encoder 125 including two constituent encoders. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, encoder 125 includes multi-block buffer 210, multiplexer (MUX) 211, data word buffer 212, controller 220, and first and second (error control code) encoders 221, 223.

Multi-block buffer 210 is provided to receive multiple data words or blocks of data words from a data processing system or the like for encoding. Controller 220 is coupled to each of multi-block buffer 210, MUX 211, data word buffer 212 and first and second encoders 221, 223 in order coordinate the operation of encoder 125. More specifically, controller 220 is connected to provide multi-block buffer 210 a control signal to advance a data word pointer to the next data word for encoding. Controller 220 is connected to provide MUX 211a control signal that enables MUX 211 to pass the data word from multi-block buffer 210 to data word buffer 212. Controller 220 is connected to provide data word buffer 212 a control signal that flags data included therein as valid. In some implementations, controller 220 provides two or more first data segments of the data word from data word buffer 212 to first encoder 221 for encoding. Controller 220 also provides one or more second data segments of the data word from data word buffer 212 to second encoder 223 for encoding. Each of the one or more second data segments also includes a sequential portion of the data spanning two or more of the first data segments. In some implementations, controller 220 is connected to provide first encoder 221 with a control signal that enables first encoder 221 to receive or select two or more first data segments from data word buffer 212. Controller 220 is also connected to provide second encoder 223 with a control signal that enables the second encoder 223 to receive or select one or more second data segments from data word buffer 212. Each of the one or more second data segments also includes a sequential portion of the data spanning two or more of the first data segments.

In some implementations, controller 220 is a portion of a memory controller operable to write the codeword into a storage medium. In some implementations, the memory controller is a flash memory controller. In some implementations, the memory controller includes a storage medium interface operable to write the codeword into the storage medium.

Figure 2B:
FIG. 2B is a diagram of three parity segments produced by a first one of the constituent encoders in FIG. 2A from three respective data segments of a data word.

First encoder 221 generates two or more first parity segments from the two or more first data segments of the data word. Each of the two or more first data segments includes a respective sequential portion of the data word. For example, as shown in FIG. 2B, data word 200 is divided into three sequential data segments 201, 202, 203. Each segment is encoded independently of the others, by first encoder 221, to produce one of three respective parity segments 201a, 202a, 203a. In some implementations, a data word is divided into a fewer or a greater number of data segments, and accordingly a fewer or a greater number of corresponding parity segments are generated by first encoder 221. In some implementations, first encoder 221 includes a Bose Chaudhuri Hocquenghem (BCH) code encoder.

Figure 2C:
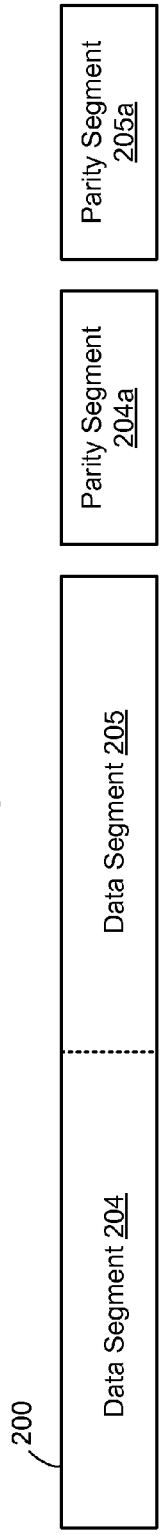
FIG. 2C is a diagram of two other parity segments produced by a second one of the constituent encoders in FIG. 2A from two respective data segments of the data word.

Simultaneously or otherwise, second encoder 223 generates one or more second parity segments from one or more second data segments of the same data word. Each of the one or more second data segments includes a respective sequential portion of the data word. Each of the one or more second data segments also includes a sequential portion of the data spanning two or more of the first data segments. For example, as shown in FIG. 2C, the same data word 200 is divided into two sequential data segments 204, 205, and each segment is encoded independently of the other, by the second encoder 223, to produce one of two respective parity segments 204a, 205a. Moreover, with reference to FIGS. 2B and 2C, each of the two sequential data segments 204, 205 includes data that spans at least two of the three data segments 201, 202, 203 encoded by first encoder 221. In some implementations, a data word is divided into a fewer or a greater number of data segments, and accordingly a fewer or a greater number of corresponding parity segments are generated by second encoder 223. In some implementation, second encoder 223 includes a low density parity check (LDPC) code encoder.

As described in greater detail below, the arrangement of the overlap amongst the data segments encoded by first and second encoders 221, 223 enables a corresponding pair of decoders to share successful decoding results. In some implementations, corrected information is passed from one constituent decoder to another in order to improve the ability to correct non-uniform error distributions. For example, errors in one of the first three data segments 201, 202, 203 can be decoded independently of the others. When one segment 201, 202, 203 is easier to correct than another for a first decoder, the corrected data from that segment can be sent to a second decoder for use when decoding the second two data segments 204, 205 using the corresponding parity segments 204a, 205a. The corrected bits passed from the first decoder improve the likelihood that at least one of the second two data segments 204, 205 will be fully corrected, and will in turn, provide corrected data back to the first decoder to assist in the decoding of the remaining data segments that have yet to be corrected.

FIG. 3A is a schematic diagram of another implementation of a parallel concatenated code encoder 125a. FIG. 3B is a schematic illustration of a codeword 300 produced by the encoder 125a. Encoder 125a illustrated in FIG. 3A is similar to and adapted from encoder 125 illustrated in FIG. 2A. Again, while certain specific features are illustrated, those skilled in the art will appreciate from the present disclosure that various other features have not been illustrated for the sake of brevity and so as not to obscure more pertinent aspects of the implementations disclosed herein.

Encoder 125a includes multi-block buffer 310, BCH encoder 321, LDPC encoder 323, controller 320, and optionally 2D-XOR encoder 325, which operates as a multi-block failsafe encoder. BCH encoder 321 and LDPC encoder 323 are arranged in parallel to operate independently on the same data word.

In operation, BCH encoder 321 and LDPC encoder 323 operate in parallel on the same two or more segments of a data word. That is, for each codeword 300 produced by the encoder 125a, BCH encoder 321 and LDPC encoder 323 each receive two or more segments of the same data word from the multi-block buffer 310. Multi-block buffer 310 has the capacity to include the data of a large set of data words. Accordingly, the BCH encoder 321 and the LDPC encoder 323 are configured to receive two data segments 301, 302 for each codeword 300 produced. The two data segments 301, 302 are a part of a single data word, and together include all of the data word. BCH encoder 321 produces respective BCH parity sets 303 and 304 for data segments 301 and 302, respectively. LDPC encoder 323 produces one LDPC parity set 305 for the data word as a whole (i.e., the two data segments 301, 302 together). In some implementations, the segment delineations are not considered by LDPC encoder 323 in the example illustrated. As such, LDPC encoder 323 receives the data word as a whole without regard to the segment delineations used by BCH encoder 321. With further reference to FIG. 1, in operation, each codeword produced is stored in storage medium 130 by operation of storage medium I/O interface 128.

In some implementations, 2D-XOR encoder 325 encodes a set of data words together, such that the set of data words includes the data word encoded by the first encoder (i.e., BCH encoder 321) and second encoder (i.e., LDPC encoder 323).

Figure 4:
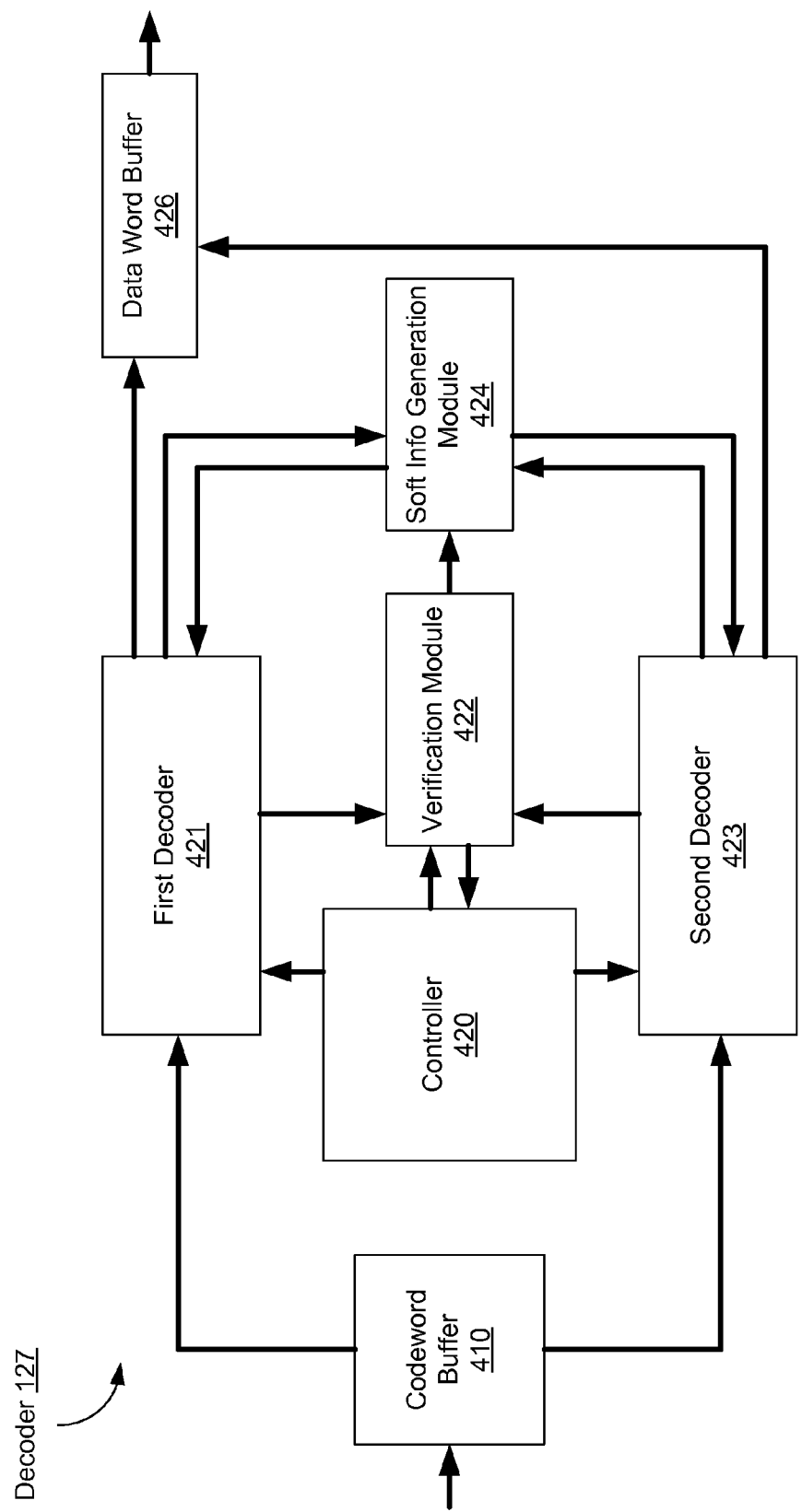
FIG. 4 is a schematic diagram of an implementation of a parallel concatenated code decoder.

FIG. 4 is a schematic diagram of an implementation of a parallel concatenated code decoder 127 operable to provide the reciprocal function of encoder 125 of FIG. 2A. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, decoder 127 includes codeword buffer 410, controller 420, verification module 422, soft information generation module 424, data word buffer 426, and first and second decoders 421, 423.

Codeword buffer 410 is provided to receive a codeword read from a storage medium. With further reference to FIG. 1, in some implementations the codeword is read from storage medium 130 by storage medium I/O 128. In some implementations, in which the decoder is used in a communication system (e.g., a wireless network), the codeword is included in a received message. Those skilled in the art will appreciate that where a codeword or group of codewords is received from depends on the type of system the error control system is implemented within. For the sake of brevity, an exhaustive list of applications for error control has not been provided.

Controller 420 is coupled to each of verification module 422, soft information generation module 424, and first and second decoders 421, 423 in order coordinate the operation of decoder 127. Controller 420 is connected to receive a verification indicator from verification module 422 and provide a control signal to verification module 422 and soft information generation module 424 in response. In turn, soft information generation module 424 is connected to receive a control signal from verification module 422. Controller 420 is also operable to pass a partial decoding result from first decoder 421 to second decoder 423 when a first respective decoding flaw is detected in the decoding result of first decoder 421. Similarly, controller 420 is operable to pass a partial decoding result from second decoder 423 to first decoder 421 when a second respective decoding flaw is detected in the decoding result of the second decoder 423.

In some implementations, controller 420 is a portion of a memory controller operable to read the codeword from a storage medium. In some implementations, memory controller 420 is a flash memory controller. In some implementations, memory controller 420 includes a storage medium interface operable to read the codeword from the storage medium.

In some implementations, verification module 422 evaluates decoding results of first decoder 421 and second decoder 423, and signals controller 420 when one or more decoding flaws are detected in the decoding result of at least one of first decoder 421 and second decoder 423. In some implementations, verification module 422 evaluates a decoding result produced by one of first decoder 421 and second decoder 423, and signals controller 420 when a decoding flaw is detected in the decoding result.

Soft information generation module 424 is also coupled to receive decoding information from at least one of first and second decoders 421, 423 and provide soft information to at least one of first and second decoders 421, 423. More generally, a soft information generation module converts the decoding result of a first decoder into soft information, which includes at least a portion of the partial decoding result. In some implementation, the soft information includes at least one of conditional probabilities (i.e., transition probabilities) associated with the codeword and log-likelihood ratios (LLRs) associated with the codeword. In some implementations, a first decoder is operable to utilize a partial decoding result from a second decoder when available. In some implementations, the partial decoding result from the second decoder includes soft information produced by the second decoder.

As would be known to those skilled in the art, for many error control codes, the decoding process can often be improved by using soft information. Hard information decoding generally means that absolute decisions are made as to whether a data value (e.g., data-bit or code-bit) is one symbol or another in a particular symbol alphabet. For example, in a binary system, a particular data value can be either "0" or "1", even if the raw electrical analog value read from a storage location does not indicate that the electrical value representing the data value is sufficient to decide with certainty that the data value is "0" or "1." In other words, a hard-decision for a particular data value is based on the most likely symbol corresponding to the analog electrical value read from the storage medium, and the probabilities that alternative decisions exist are ignored by the hard-decision process. Often the hard-decision is based on the Euclidian distances from the analog read value to electrical level(s) defining the symbols. By contrast, in the context of memory systems, the use of soft information is based on the probabilities that different outcomes exist in view of what is read from the storage medium.

Controller 420 is also connected to provide first decoder 421 with a control signal that enables first decoder 421 to select two or more first data segments and the corresponding two or more first parity segments from codeword buffer 410. Similarly, controller 420 is also connected to provide second decoder 423 with a control signal that enables second decoder 423 to select one or more second data segments and the corresponding two or more second parity segments from codeword buffer 410. For example, with reference to FIG. 2B, in one implementation, the codeword includes data word 200 divided into the three data segments 201, 202, 203 and three corresponding parity segments 201a, 202a, 203a. Additionally, with reference to FIG. 2C, the same codeword also includes parity segments 204a, 205a corresponding to segments 204, 205 of data word 200.

More generally, a controller provides the two or more first data segments and two or more parity segments to a first decoder for decoding, and provides one or more second data segments from the data word to a second decoder for decoding. In some implementations, the controller is further operable to provide decoded data from the first decoder, associated with each of the successfully decoded first data segments to the second decoder when at least one of the two or more first data segments is not successfully decoded and at least another one of the two or more first data segments is successfully decoded.

First decoder 421 decodes each of the first three data segments 201, 202, 203 and the corresponding parity segment 201a, 202a, 203a independently. More generally, a first decoder decodes a codeword by utilizing two or more first parity segments included in the codeword and two or more first data segments of the data word included the codeword. Each of the two or more first parity segments is associated with a respective one of the two or more first data segments. Each of the two or more first data segments includes a respective sequential portion of the data word. In some implementations, the first decoder is operable to provide decoded data for each of the two or more first data segments that are decoded successfully independent of failing to successfully decode any of the other two or more first data segments.

With reference to FIGS. 2B and 4, first decoder 421 decodes the combination of the data segment 201 and the parity segment 201a independent of data segments 202, 203 and the parity segments 202a, 203a, and so on. If one segment can be corrected (e.g., because it has fewer errors than the error correction capability of its parity segment, or the distribution of errors within the segment does not exceed the error correction capability of its parity segment), the corrected data from that particular segment can be sent to second decoder 423, irrespective of whether the other segments can be corrected. This feed forward mechanism improves the likelihood that at least one of the second two data segments 204, 205 will be fully corrected by second decoder 423.

Similarly, second decoder 423 decodes each of the second two data segments 204, 205 and the corresponding parity segment 204a, 205a independently, so that corrected information from one of the two data segments can be sent to the first decoder 421. More generally, a second decoder decodes the same codeword by utilizing one or more second parity segments included in the codeword and one or more second data segments of the data word in the codeword. Each of the one or more second parity segments is associated with a respective one of the one or more second data segments. Each of the one or more second data segments includes a sequential portion of data included in a plurality of the two or more first data segments.

In some implementations, second decoder 423 utilizes a partial decoding result from first decoder 423 when available. In some implementations, this feed forward mechanism improves the likelihood that first decoder 421 will be able to fully correct at least one of the remaining uncorrected data segments. The process iterates between first decoder 421 and second decoder 423 until either the data is fully corrected or the errors are determined to be uncorrectable based on a fixed number of iterations.

Figure 5:
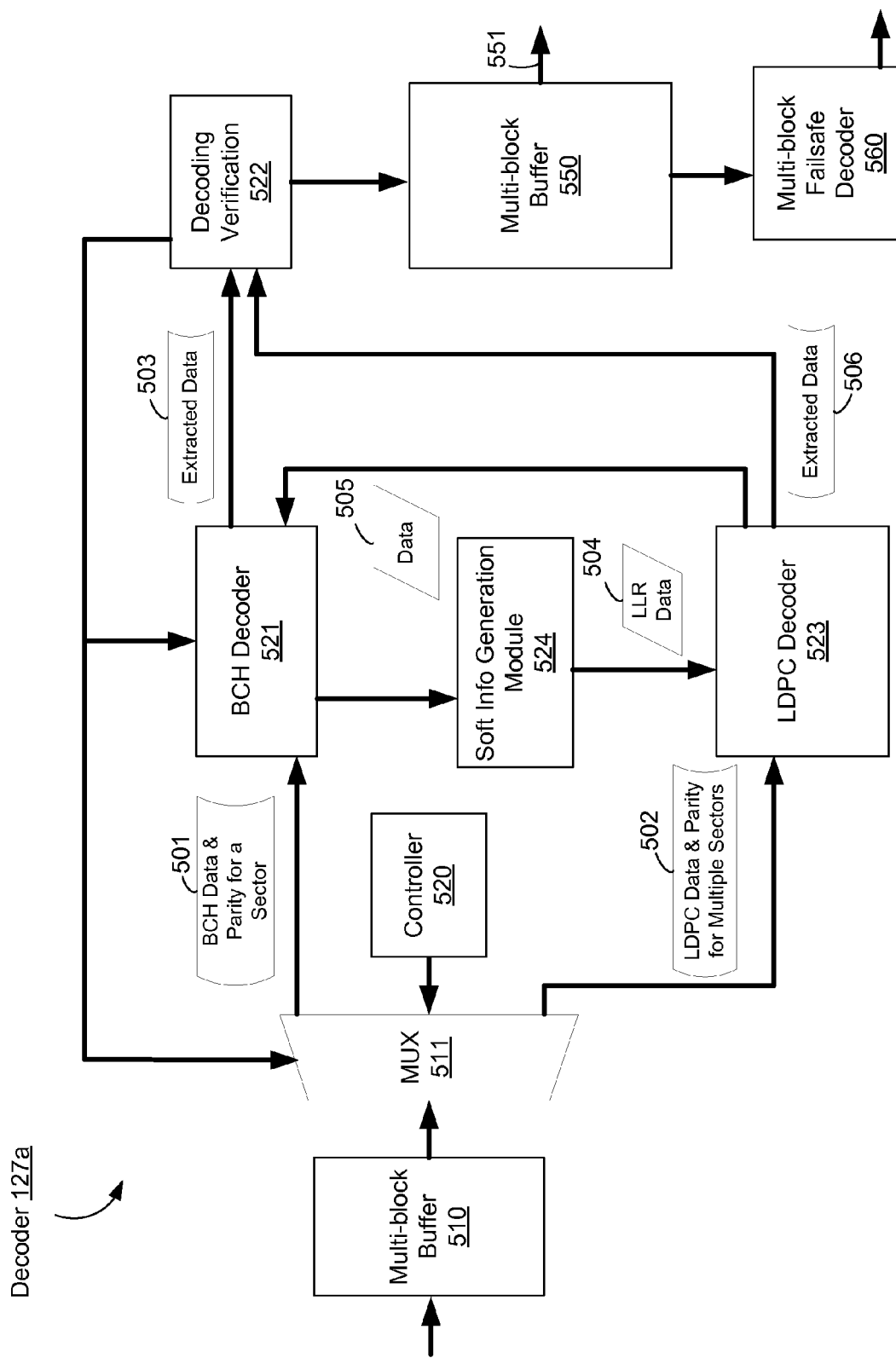
FIG. 5 is a schematic diagram of an implementation of a parallel concatenated code decoder.

FIG. 5 is a diagram of an implementation of a parallel concatenated code decoder 127a operable to provide the reciprocal function of encoder 125a of FIG. 3A. Decoder 127a illustrated in FIG. 5 is similar to and adapted from decoder 127 illustrated in FIG. 4. Again, while certain specific features are illustrated, those skilled in the art will appreciate from the present disclosure that various other features have not been illustrated for the sake of brevity and so as not to obscure more pertinent aspects of the implementations disclosed herein. To that end, decoder 127a includes input multi-block buffer 510, data selection block 511 (e.g., MUX), BCH decoder 521, LDPC decoder 523, decoding verification module 522, output multi-block buffer 550, and optional multi-block failsafe decoder 560.

The implementation described herein is a form of reverse concatenation, where BCH decoder 521 and LDPC decoder 523 are able to pass corrected information to one another. However, unlike other reverse concatenation schemes that use an interleaver (and thus require a de-interleaver), the conventional distinction between an inner code and an outer code do not impose limitations on the operation of the decoding scheme described herein. Subsequently, either BCH decoder 521 or LDPC decoder 523 can be used to start the decoding process. The decoder selected to start a decoding process (e.g., BCH decoder 521) can be based on either hard decisions or soft decisions of the data, depending on the system requirements limiting parity and/or performance for a specific channel capacity. The flow of information is either controlled by a controller (e.g., controller 520) or embedded logic applying a message passing process based on the results of each decoder. In some implementations, the message passing process control is included in decoding verification module 525.

For example, in some implementations, BCH decoder 521, or another similarly low complexity polynomial decoder, is used to start the decoding process. The output of BCH decoder 521 is used to steer the next steps of the decoding process. More specifically, BCH decoder 521 receives BCH data and parity for a particular segment 501, and the decoding result from BCH decoder 521 is used to steer the operation of the decoder 127a. If BCH decoder 521 produces fully corrected data, the extracted data 503 is outputted directly to a buffer (e.g., output buffer 550) or controller. If BCH decoder 521 fails, soft information, in the form of log-likelihood ratios (LLR) is passed to LDPC decoder 523, which also receives LDPC data and parity 502 for at least two segments that were LDPC encoded together.

Soft information, in the form of LLRs 504, is produced by soft information generation module 524 using the decoding result generated by BCH decoder 521. In some implementations, LLRs 504 of segments that are successfully decoded are also be passed back to LDPC decoder 523, with LLRs 504 indicating that the segment is correct along with the data. In these implementations, LDPC decoder 523 uses LLRs 504 of successfully decoded segment(s) to reduce the complexity of the remaining decoding process.

In the current example, since the LDPC codeword is composed of two or more BCH data segments, if one or more of the BCH segments are uncorrectable by BCH decoder 521, LDPC decoder 523 is engaged and operates to correct the LDPC codeword. Additionally, because LDPC decoding is probabilistic, the output of LDPC decoder 523 represents a bit-by-bit solution. In some implementations, the bit-by-bit solution (i.e., data 505) is fed forward to BCH decoder 521 to decode once again or is output, as extracted data 506, to buffer 550 or a controller when data 505 is confirmed as correct. If BCH decoder 521 fails to decode one or more segments again, the process is iterated. In some implementations, there is an option to pass or indicate failure after a threshold number of iterations.

In some implementations, an outer CRC (cyclic redundancy check) decoder is used to check for missed corrections and selectively direct data to one of buffer 550, controller 520 or BCH decoder 521. Depending on the granularity of the CRC code (i.e., the smallest message length the code operates on), both point-to-point and end-to-end checks of the data stream and the storage medium can be established. In some implementations, a respective CRC value is inserted in into each data segment 201, 202, and 203 (see FIG. 2B) and is retained throughout the transmission and storage of the attached data. The CRC value can be checked, by decoding verification module 522, at any point during the decoding process to check for miss-corrections and the algorithm restarted with a retry or other process to enhance the quality of the original information using the controller 520 or the BCH decoder 521 if the data segment in error can be identified. If the CRC decoder detects an error, the data is sent back to the BCH decoder 521 and then returned if corrected. In some implementations, if uncorrected, the data is sent to an additional outer code decoder, such as a 2-D XOR decoder or other multi-block failsafe error control decoder 560. The resulting corrected data is then returned by controller 520 to the BCH decoder 521 or the LDPC decoder 523, depending upon the estimated number of errors remaining. In this process of forward and reverse steering, the codeword is resolved until all decoders (e.g., both the BCH decoder 521 and the LDPC decoder 523) indicate a passing condition. In some implementations, the multi-block failsafe decoder 560 is not invoked unless the other decoders are unable to correct the data.

In some enterprise storage implementations, the transmission to-and-from the storage device includes the utilization of a CRC code. For example, in some implementations, a CRC code provides a check value that is attached to the data stream shown in FIG. 3B 300 and stored in the media along with the data segments and parity. With further reference to FIG. 5, in some implementations the CRC code is considered to be an outer code that is evaluated by multi-block failsafe decoder module 560 to steer the data for a re-check upon an error to prevent a final miss-correction.

In some implementations, including a failsafe outer code (e.g., an outer code evaluated by multi-block failsafe decoder 560 in FIG. 5) enables lower error floors by providing error correction for at least some of the errors that could not be corrected by the combination of BCH decoder 521 and LDPC decoder 523. For example, in some implementations, an error floor of 1E-20 is possible using a 2-D XOR coder if the inner coders (e.g., BCH and LDPC) reach an error floor of 1E-6, with parity accounting for less than 5% of the total data. In some implementations, decoders can be customized to achieve wide ranges of error floors depending on the number of non-linear data defects that occur in the storage medium. In some implementations, the lower bound of the error floors is limited by the number of non-linear data defects that occur in the storage medium. Non-linear defects normally arise when there exists a severe clustering of defects due to a random event. For example, non-linear defects are often encountered in NAND flash memory devices as a result of some types of device deterioration that cause severe data loss. Non-linear defects can be modeled as mixtures of error distributions that are uncharacteristic of the expected deterioration of the memory device. For example, in NAND flash memory devices, non-linear defects occur when two word lines short after an indeterminate period of program and erase cycles, causing several kilobytes of data errors. There are several factors that shape these defect distributions, such as operating temperature, time between programming, mode of operation, and history of use. Limits on a storage system's ability to recover from non-linear and other defects that exist at the tail of some error distributions typically limits the actual uncorrectable bit error rate (UBER) that can be achieved in the storage system.

In some implementations, multi-block failsafe decoder 560 is operable to decode a set of codewords, where the set of codewords includes at least the data word of the codeword decoded by BCH decoder 521 (i.e., first decoder) and LDPC decoder 523 (i.e., second decoder).

Figure 6:
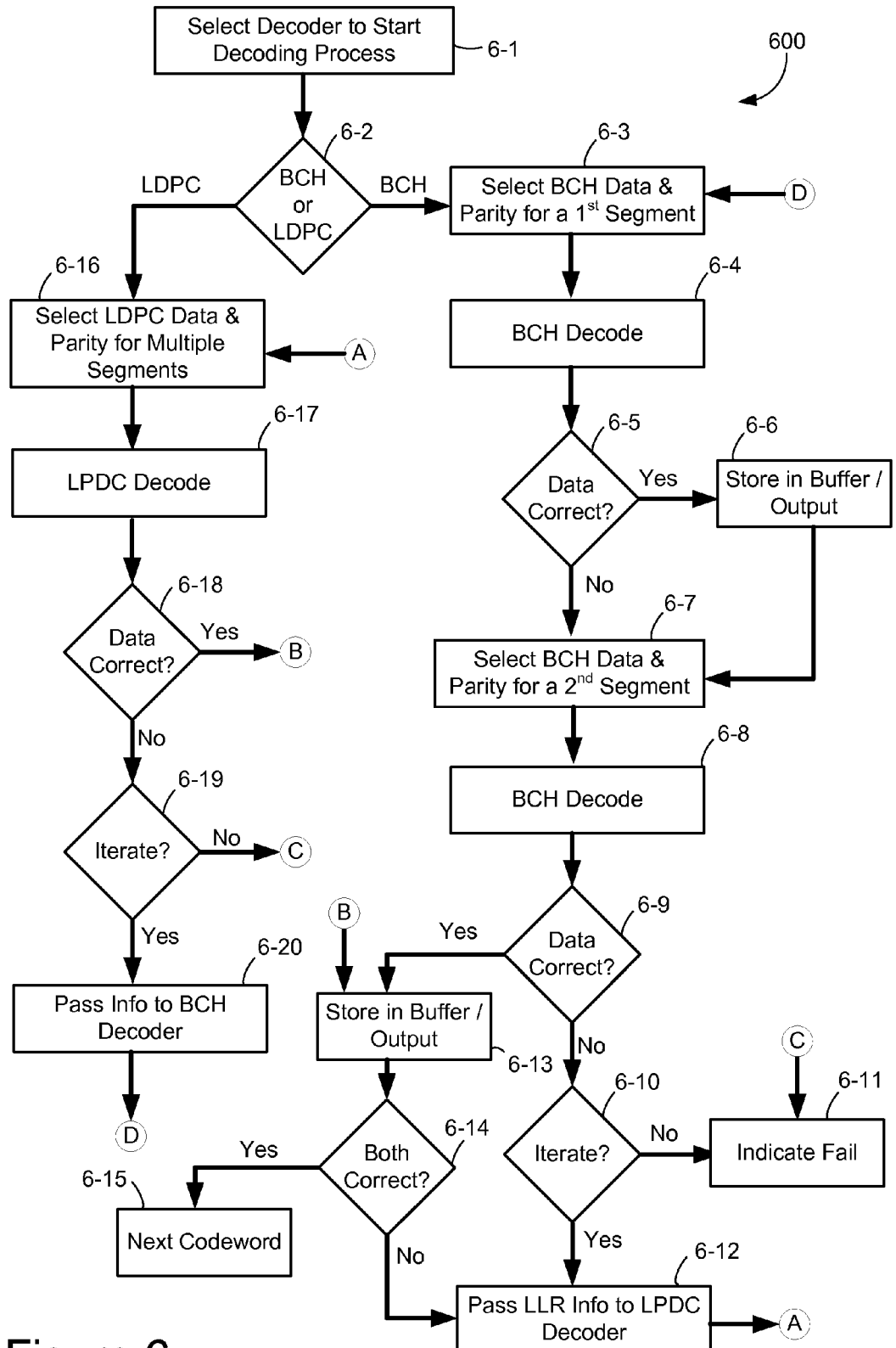
FIG. 6 is a flowchart representation of an implementation of a method of parallel concatenated code decoding.

FIG. 6 is a flowchart representation of an implementation of a method 600 of parallel concatenated code decoding suitable for use with decoder 127a of FIG. 5. As represented by block 6-1, the method 600 includes selecting a decoder to start the decoding process. As represented by block 6-2, the method 600 includes determining which decoder was selected. If the BCH decoder is selected ("BCH" path from block 6-2), as represented by block 6-3, the method 600 includes selecting BCH data and parity for a first data segment of a data word. On the other hand, if the LDPC decoder is selected ("LDPC" path from block 6-2), as represented by block 6-16, the method 600 includes selecting LDPC data and parity for multiple data segments (e.g., two data segments would be selected for decoder 127a of FIG. 5) of the data word.

Returning to block 6-3, after selecting BCH data and parity for a first segment, as represented by block 6-4, the method 600 includes BCH decoding the BCH data and parity for the first segment. As represented by block 6-5, the method 600 includes determining whether the decoding provided correct data for the first segment. If the data is correct ("Yes" path from block 6-5), as represented by block 6-6, the method 600 includes writing the correct data to the output buffer and/or outputting the data before proceeding to the portion of the method 600 represented by block 6-7. On the other hand, if the data is not correct ("No" path from block 6-5), as represented by block 6-7, the method 600 includes selecting BCH data and parity for a second segment, which would be the segment that was LDPC encoded along with the first segment selected.

As represented by block 6-8, the method 600 includes BCH decoding the BCH data and parity for the second segment. As represented by block 6-9, the method 600 includes determining whether the decoding process provided correct data for the second segment. If the data is correct ("Yes" path from block 6-9), as represented by block 6-13, the method 600 includes writing the correct data to the output buffer or outputting the data before proceeding to the portion of the method 600 represented by block 6-14. As represented by block 6-14, the method 600 includes determining whether the decoding provided correct data for both the first and second segments. If the data for both segments is correct ("Yes" path from block 6-14), as represented by block 6-15, the method 600 includes selecting the next codeword for decoding. On the other hand, if the data for at least one of the segments is not correct ("No" path from block 6-14), as represented by block 6-12, the method 600 includes passing LLR information to the LDPC decoder for the first and second segments selected.

Returning to block 6-9, on the other hand, if the decoded data for the second segment is not correct ("No" path from block 6-9), as represented by block 6-10, the method 600 includes determining whether to further iterate the decoding process. In some implementations, the decision to further iterate is based on a number of factors, including without limitation, the number of prior iterations, the extent of data corruption/error and time available for further iteration.

If further iteration is warranted ("Yes" path from block 6-10), as represented by block 6-12, the method 600 includes passing LLR information to the LDPC decoder for the first and second segments selected. On the other hand, if further iteration is not warranted ("No" path from block 6-10), as represented by block 6-11, the method 600 includes providing an indication that at least this portion of the decoding process has failed.

Returning to block 6-16, after selecting LDPC data and parity for the multiple segments, as represented by block 6-17, the method 600 includes decoding the LDPC data and parity. As represented by block 6-18, the method 600 includes determining whether the decoding provided correct data for the second segment. If the data is correct ("Yes" path from block 6-18), as represented by block 6-13, the method 600 includes writing the correct data to the output buffer or outputting the data. On the other hand, if the data is not correct ("No" path from block 6-18), as represented by block 6-19, the method 600 includes determining whether to further iterate the decoding process.

If further iteration is warranted ("Yes" path from block 6-19), as represented by block 6-20, the method 600 includes passing LLR information to the BCH decoder for the first and second segments selected. On the other hand, if further iteration is not warranted ("No" path from block 6-20), as represented by block 6-11, the method 600 includes providing an indication that at least this portion of the decoding has failed.

Figure 7:
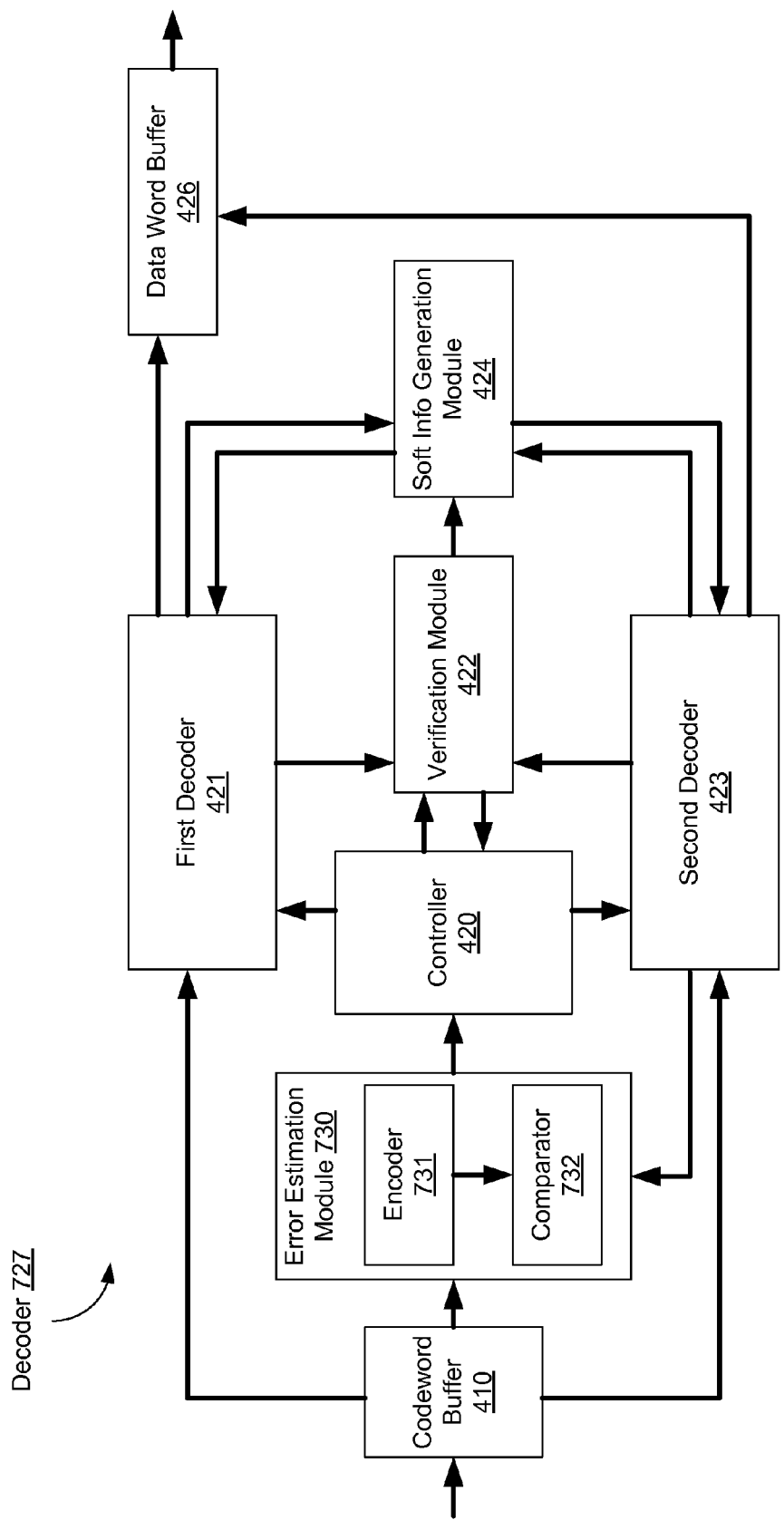
FIG. 7 is a schematic diagram of another implementation of a parallel concatenated code decoder.

FIG. 7 is a schematic diagram of another implementation of a parallel concatenated code decoder 727. Decoder 727 illustrated in FIG. 7 is similar to and adapted from decoder 127 illustrated in FIG. 4. Elements common to each include common reference numbers, and only the differences between FIGS. 4 and 7 are described herein for the sake of brevity. As compared to decoder 127, decoder 727 includes additional components or logic to select which of two decoders 421, 423 to use to start a parallel concatenated decoding process (i.e., to start decoding the codeword) based on an estimate of the number of errors in a codeword.

To that end, decoder 727 includes error estimation module 730 coupled between codeword buffer 410 and controller 420. More specifically, error estimation module 730 is connected to codeword buffer 410 to receive at least a portion of the codeword. For example, with further reference to FIGS. 2A-2C, in some implementations, error estimation module 730 is coupled to codeword buffer 410 to receive data segments 204, 205 of the data word 200 and corresponding parity segments 204a, 205a. In some implementations, error estimation module 730 is coupled to codeword buffer 410 to receive data segments 201, 202, 203 of the data word 200 and corresponding parity segments 201a, 202a, 203a.

In some implementations, error estimation module 730 includes an encoder 731 and a comparator 732. In some implementations, encoder 731 generates the same type of code as the second decoder 423, and produces one or more third parity segments from the one or more second data segments in the codeword. In turn, comparator 732 estimates the number of errors in the data word of the codeword by evaluating the one or more second parity segments and the one or more third parity segments produced by encoder 731. In some implementations, error estimation module 730 also includes a decision module to select which of first decoder 421 and second decoder 423 to use to start decoding the codeword (i.e., to start decoding the codeword with), where the selection is at least based on the estimated number of errors. To that end, in some implementations, the one or more parity segments produced by encoder 731 are compared to the one or more parity segments of the received portion of the codeword by comparator 732. For example, with further reference to FIGS. 2A-2C, parity segments 204a, 205a read from a storage medium are compared to parity segments generated by encoder 731 using data segments 204, 205 read from the storage medium.

Controller 420 selects which of first decoder 421 and second decoder 423 to use to start decoding the codeword, based on the estimate of the number of errors in the codeword provided by error estimation module 730. In some implementations, controller 420 selects first decoder 421 to start decoding the codeword in codeword buffer 410 when the estimated number of errors satisfies a threshold. Alternatively, controller 420 selects second decoder 423 to start decoding the codeword when the estimated number of errors does not satisfy the threshold. In some implementations, as described in greater detail below with reference to FIGS. 8 and 9, the threshold corresponds to a number of errors that will cause first decoder 421 to fail when selected first. In some implementations, the threshold corresponds to a number of errors that will cause first decoder 421 to fail a particular percentage of the time when selected first. In some implementations, the threshold corresponds to a number of errors that can be successfully corrected by first decoder 421.

Figure 9:
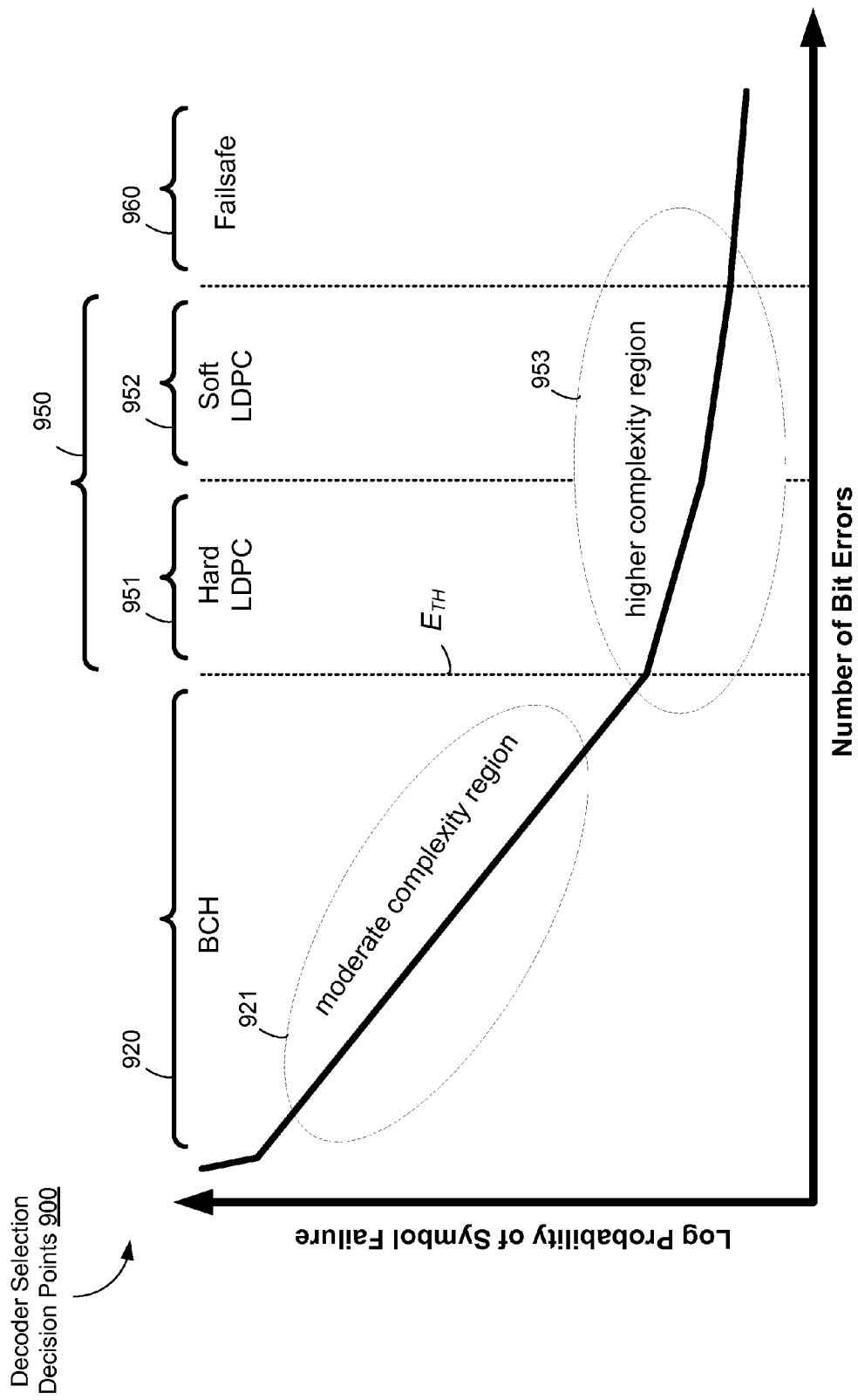
FIG. 9 is a chart showing various performance ranges and decision points enabled by the parallel concatenated coding scheme presented herein.

In some implementations, controller 420 selects second decoder 423 to start decoding the codeword using soft decision decoding when the estimated number of errors satisfies a first threshold (e.g., when the estimated number of errors is more than the first threshold). In some implementations, controller 420 selects second decoder 423 to start decoding the codeword using hard decision decoding when the estimated number of errors satisfies a second threshold (e.g., when the estimated number of errors is more than the second threshold, such as $E_{TH}$ as shown in FIG. 9, but less than the first threshold).

In some implementations, controller 420 selects first decoder 421 to start decoding the codeword using hard decision decoding when the estimated number of errors satisfies a second threshold (e.g., when the estimated number of errors is less than the second threshold, which is less than the aforementioned first threshold).

In some implementations, controller 420 is operable to select encoder 731 to evaluate a decoding result produced by one of first decoder 421 and the second decoder 423. In some implementation, controller 420 is operable to select a third decoder (not shown) for decoding when the estimated number of errors satisfies a threshold (e.g., when the estimated number of errors exceeds a third threshold, which is greater than the first and second thresholds), where the third decoder is operable to decode the codeword in combination with a plurality of other codewords. In some implementations, controller 420 is operable to select one of the first, second and third decoders when the estimated number of errors satisfies a respective one of first, second and third thresholds. Examples of such thresholds of decoder selections are explained below with reference to FIG. 9.

Figure 8:
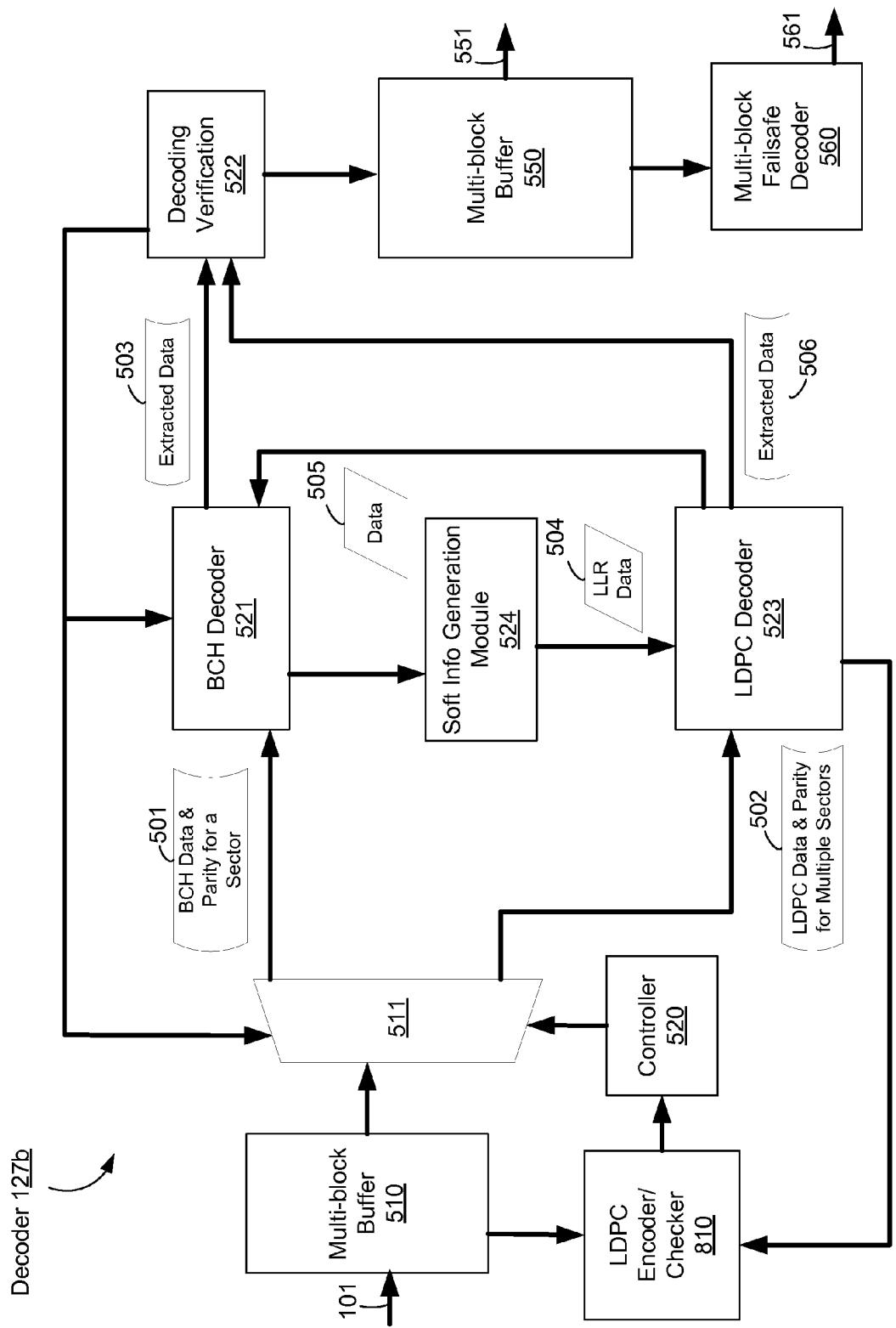
FIG. 8 is a schematic diagram of another implementation of a parallel concatenated code decoder.

FIG. 8 is a schematic diagram of another implementation of a parallel concatenated code error control decoder 127b. Decoder 127b illustrated in FIG. 8 is similar to and adapted from decoder 127a illustrated in FIG. 5. Accordingly, elements common to both share common reference indicia, and only the differences between decoders 127a, 127b are described herein for the sake of brevity. To that end, decoder 127b includes LDPC check-encoder 810 that is used to determine whether BCH decoder 521 or LDPC decoder 523 is preferred to the start the decoding process. In other words, LDPC check-encoder 810 is to steer the codeword to either BCH decoder 521 or LDPC decoder 523 to initiate the decoding process. In some implementations, LDPC check-encoder 810 is configured to estimate the number of bits errors in the LDPC codeword by evaluating the one or more LDPC parity segments of the codeword and the one or more parity segments produced by LDPC check-encoder 810. Moreover, while an LDPC check-encoder is employed in decoder 127b of FIG. 8, those skilled in the art will appreciate from the present disclosure that, in some implementations, a BCH check-encoder can be used in a similar manner. More generally, the type of check-encoder used depends on the respective type(s) of one or more error control codes used in the corresponding encoder to produce codewords.

In some implementations, as described below with reference to FIG. 9, the number of errors is compared to one or more thresholds to determine which of BCH decoder 521 and LDPC decoder 523 is preferred to start decoding the codeword.

More generally, some implementations include hard and soft decoders that are individually selectable based on the estimated number of errors in a codeword and/or group of codewords. For example, in some implementations, the flow of information during decoding between Hard LDPC Decoders, Soft LDPC decoders and BCH decoders is governed by the estimated number of errors in a codeword. In some implementations, the message passing process steers the data in an attempt to utilize less complex decoding first by attempting to resolve easier to correct errors, and then focusing on more difficult bit errors using the previously corrected portions of the data word and increasingly complex decoding as demanded by the nature of the remaining errors. For example, one strategy is to correct isolated bit errors first, and then concentrate on more complex clusters of bit errors. Using information (i.e., corrected data segments) acquired from the easier to correct bits, data retrieved with clustered defects may be recovered. Additionally, this information can be passed back to the preceding or following decoders. The same algorithm is applied to the segments of the LDPC decoder being operated on by the BCH decoder, which uses the parity bits of the codeword. In other words, corrected data output by the LDPC decoder that overlaps with a data segment for the BCH decoder can replace the overlapping portion of the data segment before attempting to decode the data segment with the BCH decoder. As such, the combination of parallel concatenated decoding and a reformation of the LDPC H-matrix discussed below can accommodate the storage medium BER characteristics in a way that normalizes random and burst errors.

Implementations of the parallel concatenated encoding and decoding processes described herein are useful in a number of situations, and in particular, in situations where the distribution of errors (in a storage medium or communication channel) is non-uniform. In the solid state devices error distributions are frequently non-uniform, and bit defects occur at a log linear rate with multiple log linear legs, as described below with reference to FIG. 9. Mathematically, this is described as a Poisson distribution with a long or fat tail. This implies that the average error rate is approximately equal to the variance.

FIG. 9 is a chart 900 showing various performance ranges and decision points that are used by some implementations of decoder 127b illustrated in FIG. 8. In particular, chart 900 shows an example of the logarithmic probability of codeword decoding failure versus the number of bit errors in a codeword for a test implementation of the decoder 127b. Additionally, chart 900 has been annotated to show regions where particular types of decoding are preferred based on decoding complexity and likelihood of success.

For example, when the number of bit errors is relatively low, such as in moderate complexity region 921, a relatively low or moderately complex decoding scheme is preferred. In some implementations, there is a bias towards choosing lower complexity decoding because lower complexity decoding is generally faster and typically uses less power than higher complexity decoding. And there is often an expectation that a low number of bit errors can be corrected with a low complexity decoding process. With continued reference to FIG. 8, in some implementations, BCH decoder 521 is less complex than LDPC decoder 523, and in some implementations BCH decoder 521 is considered a low or moderately complex decoder. In some implementations, if the estimated number of errors in the codeword produced by LDPC check-encoder 810 is below a bit error threshold, $E_{TH}$, BCH decoding can effectively handle the decoding of a codeword with low-to-moderate complexity, as indicated by range 920. In some implementations, below $E_{TH}$, BCH decoder 521 is expected to yield a correct result greater than 90% of the time, where $E_{TH}$ is a BER in the range of 1.2E-2. As such, controller 520 selects BCH decoder 521 to start the decoding process when the estimated number of errors is below $E_{TH}$. In some implementations, if the number of errors is close to the threshold $E_{TH}$ or even just beyond the threshold $E_{TH}$, where BCH decoding is more likely to fail, controller 520 may nevertheless select BCH decoder 521 to start the decoding process. However, if the number of bit errors substantially exceeds the error threshold, $E_{TH}$, it is assumed that the performance falls into higher complexity region 953.

In higher complexity region 953, BCH decoder 521 is highly likely to fail when selected first. So starting the decoding process with BCH decoder 521 may simply waste power and add unnecessary delay to the decoding process. Accordingly, controller 520 selects a more powerful and computationally more complex error control code decoder, such as LDPC decoder 523 or failsafe decoder 560, to start the decoding process. In some implementations, higher complexity region 953 is divided into two or more ranges. For example, as shown in FIG. 9, the higher complexity region 953 is divided into a LDPC range 950 and a failsafe range 960. In some implementations, the threshold between the LDPC range 950 and the failsafe range 960 is a BER of approximately 5.0E-2. In failsafe range 960, LDPC decoder 523 is more likely to fail than in lower error ranges. So in some implementations, a failsafe decoder, such as a 2-D XOR correction scheme (or another multi-block failsafe error control scheme), is used to achieve lower error floors.

In some implementations, LDPC range 950 is divided into a hard LDPC sub-range 951 and a soft LDPC sub-range 952. Sub-ranges 951, 952 are based on decoding complexity and a bias towards using lower complexity decoding when possible. Hard LDPC sub-range 951 includes BER performance that may not be reliably achieved by BCH decoding, but does not require the complexity of soft LDPC decoding. Accordingly, if the estimated number of errors falls in the hard LDPC sub-range 951, controller 520 selects LDPC decoder 523 to start the decoding process using hard decision decoding. If the estimated number of errors falls in the soft LDPC sub-range 952, controller 520 selects the LDPC decoder 523 to start the decoding process using soft decision decoding. In some implementations, hard LDPC sub-range 951 extends between 1.2E-2 and 3.0E-2, and soft LDPC sub-range 952 extends between 3.0E-2 and 5.0E-2 (i.e., up to the failsafe region 960).

With further reference to FIG. 8, in some implementations, LDPC check-encoder 810 can also be used to evaluate the output of LDPC decoder 523. For example, when LDPC decoder 523 fails to produce corrected data, LDPC check-encoder 810 can be used to produce information about the remaining errors. In some implementations, the information about the errors is used to steer the information flow between BCH decoder 521 and LDPC decoder 523, or declare that the codeword includes an irresolvable error.

Figure 10:
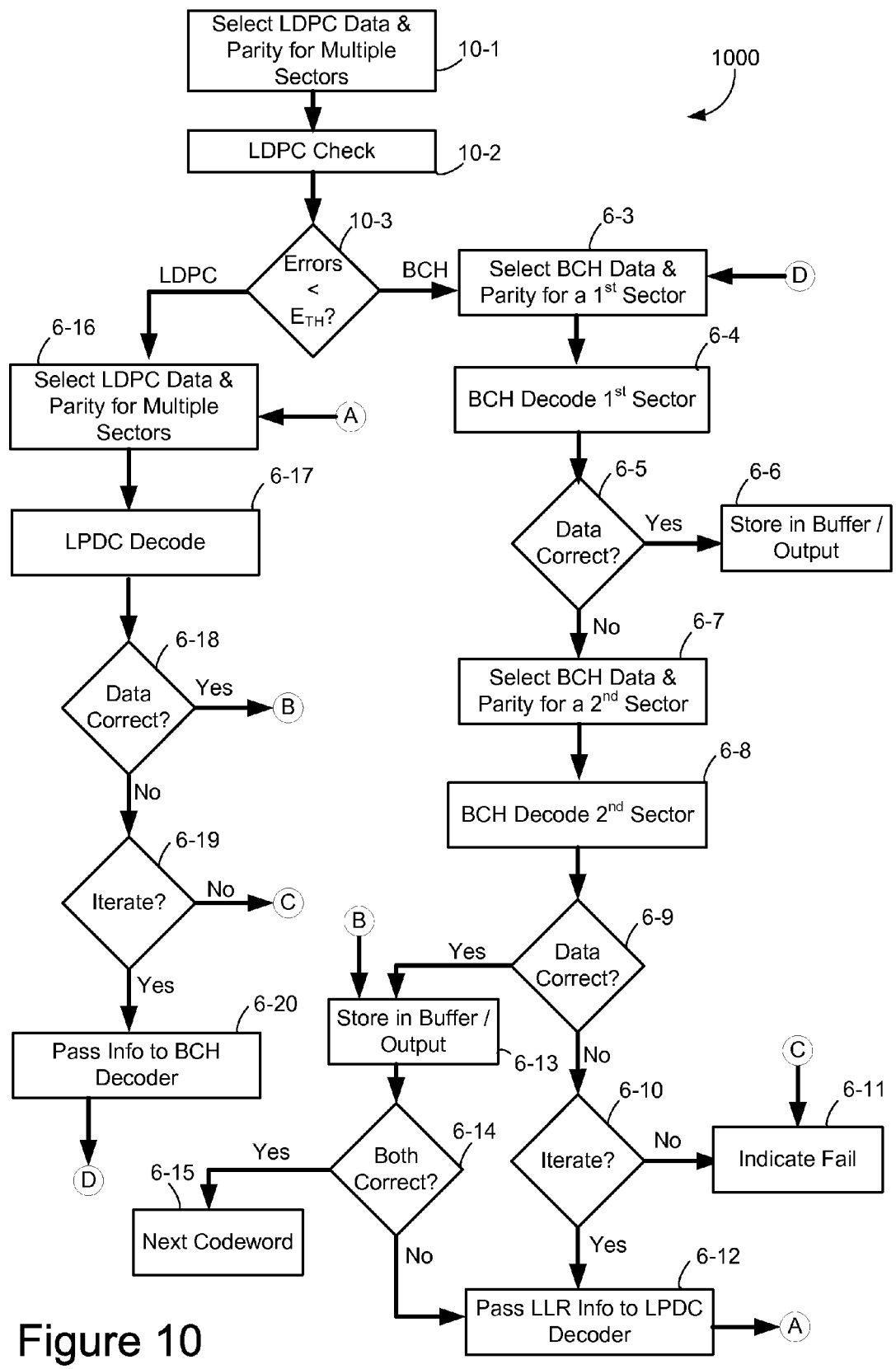
FIG. 10 is a flowchart representation of an implementation of a method of parallel concatenated code decoding.

FIG. 10 is a flowchart representation of an implementation of a method 1000 of parallel concatenated code decoding. The flowchart illustrated in FIG. 10 is similar to and adapted from the flowchart illustrated in FIG. 6. As such, elements common to both share common reference indicia, and only the differences between the two flowcharts are described herein for the sake of brevity. As represented by block 10-1, method 1000 includes selecting LDPC data and parity for multiple segments (e.g., two segments would be selected for decoder 127b of FIG. 8). As represented by block 10-2, method 1000 includes using an LDPC check-encoder to estimate the number of bits errors in the codeword. As represented by block 10-3, method 1000 includes determining whether the error estimate is below an error threshold (e.g., $E_{TH}$ in FIG. 9).

If the estimated number of errors is below the error threshold $E_{TH}$ ("BCH" path from block 10-3), method 1000 continues from block 6-3, as described above with reference to FIG. 6. On the other hand, if the estimated number of errors is not below the error threshold $E_{TH}$ ("LDPC" path from block 10-3), method 1000 continues from block 6-16, as described above with reference to FIG. 6.

Additionally, as noted above, various implementations are used to enable matching the probabilities of bit errors at particular memory locations to the error correction capability and characteristics of an error correction code. More specifically, in some implementations an error control system includes an error tracking module and a code adaptation module. The error tracking module produces error location statistics. The code adaptation module produce adjustments for an adjustable generator matrix (used by an encoder) and an adjustable parity-check matrix (used by a decoder), based on the error location statistics. In other words, error probabilities associated with specific memory locations can be integrated into the error control code to alter the probability of whether a codeword is correctable.

To that end, in some implementations, irregular error control codes are used because some of the check bits are more interconnected to data bits than others. For example, in some implementations, the LDPC encoder and decoder utilize irregular codes. LDPC codes are often characterized as capacity-approaching, which means that there are LDPC codes that correct errors in noisy conditions very close to the Shannon limit for a symmetric memory-less channel with a reasonable degree of complexity. Accordingly, the time it takes for capacity-approaching LDPC error correction varies linearly in relation to the code block length. Additionally, those skilled in the art will appreciate that LDPC codes are a family of linear codes that may be designed using a bipartite graph G, in which one column of nodes includes message nodes n, and the other column includes check nodes k. The graph G generates a linear code of block length n and dimension of at least n–k as follows. The n coordinates of a codeword are associated with the n message nodes. The codewords are those vectors $(c_1, \ldots, c_n)$ such that for all check nodes the sum of the neighboring positions among the message nodes is zero.

Figure 12:
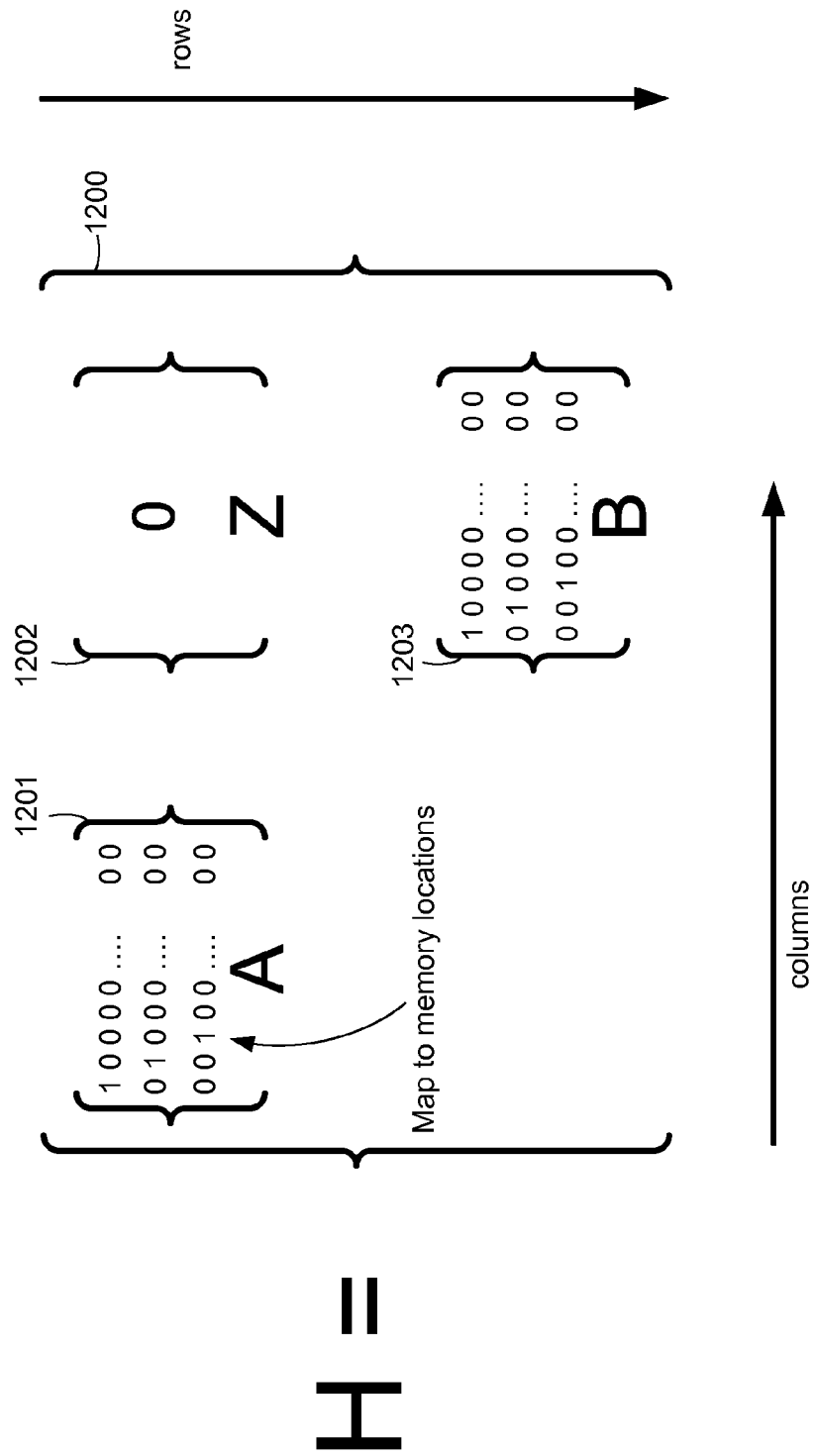
FIG. 12 is a schematic diagram of an implementation of a parity-check matrix for an irregular low density parity check (LDPC) code.

The aforementioned graph representation may be converted to a parity-check matrix as follows. The matrix H (i.e., a parity check matrix) is defined as a binary k×n matrix in which each entry (i, j) is 1 (or, more generally, a predefined value) if and only if the $i^{th}$ check node is connected to the $j^{th}$ message node in the graph G. Equivalently, for binary data, the columns of the matrix H represent the variable bits (i.e., the data bits or message bits), and the rows of the matrix H represent the check bits. Given the definition of the matrix H, the LDPC code defined by the graph G is the set of vectors $c=(c_1, \ldots, c_n)$, such that $H \cdot c^\tau = 0$. However, those skilled in the art will also appreciate that not every binary linear code can be represented by a sparse bipartite graph. Sparseness applies to sequences of matrices, and a sequence of k×n matrices is called c-sparse if the product of k times n tends to infinity and the number of nonzero elements in the sequence of k×n matrices is less than the product of k times n. That is, the connections in the graph G (between the check bits and the variable bits) scales roughly linearly with the dimensions of the matrix rather than quadratically (or exponentially). A binary linear code that has a representation as a sparse bipartite graph may be one of a LDPC code, a turbo code, a repeat and accumulate code, or a family of fountain codes. An example of a LDPC parity-check matrix 1200 satisfying these conditions is schematically illustrated in FIG. 12. As described in greater detail below, parity-check matrix 1200 is an irregular matrix (i.e., some rows of the matrix 1200 have more elements with non-zero values than other rows).

Unlike regular LDPC decoders, irregular LDPC decoders work based on the principle that some check bits are more interconnected to the variable bits than others. If a check bit is more interconnected, that check bit will typically flag errors more often. The less interconnected check bits tend to converge faster than the more interconnected check bits. Subsequently, information from the less interconnected check bits assists the decoding of the more interconnected check bits. In some implementations, these and other characteristics of irregular codes are used to selectively map the physical nature of the storage medium to the interconnectivity of the check bits. For example, in some implementations, memory locations with higher probabilities of bit errors are mapped to the more interconnected check bits of the code. Alternatively, in some implementations, the memory locations with higher probabilities of bit errors are mapped to the less interconnected check bits of the code.

The H-matrix design employs characteristics of the higher channel capacity capability of irregular LDPC decoders to correct more bits with similar amounts of parity overhead. The concept is similar to the message passing scheme presented above, but here the probabilistic LDPC decoder is enabled to work using Bayesian probabilities. That is, prior error probabilities about the channel can be integrated into the decoder to alter the probability of whether a segment of the LDPC codeword would be more or less correctable if sent back to the BCH decoder.

In some implementations, the practical effect of the H-matrix mapping changes the magnitude of the tail when modeling the probability of error as a function of bits failing as shown in FIG. 9. The characteristic of the tail of the distribution can be altered, allowing some segments of the LDPC codeword to be easier to correct than others. So, when the output from the LDPC decoder is sent to the BCH decoder, it is more likely that the BCH decoder can correct some of the segments that remain in error over the iterations. This enables the parallel concatenated decoder to work more efficiently at converging to a valid codeword, making the message passing between decoders more likely to converge on the correct data word.

Figure 11:
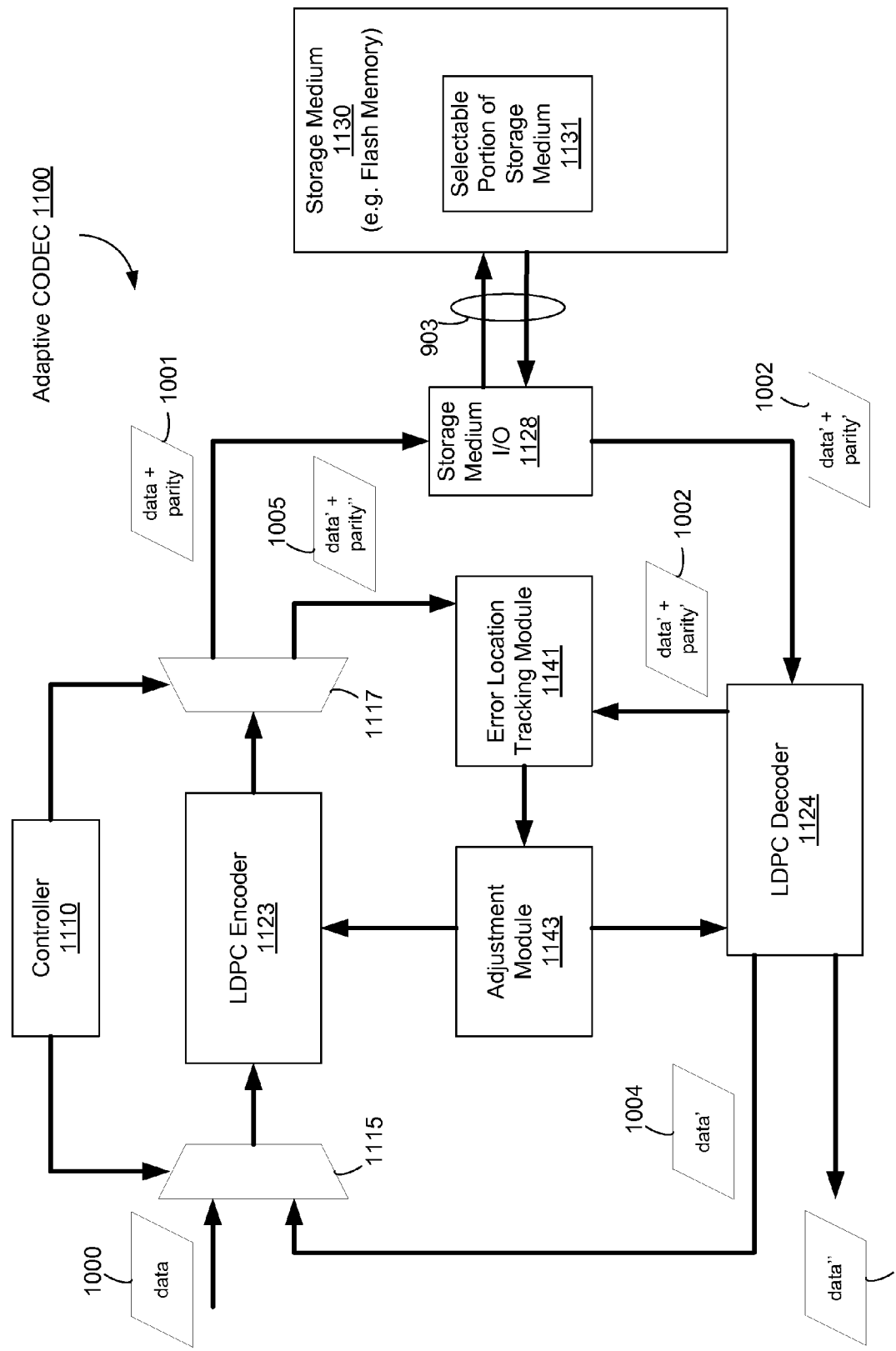
FIG. 11 is a schematic diagram of an implementation of an adaptive error control coding system.

FIG. 11 is a schematic diagram of an implementation of an adaptive CODEC (encoder-decoder) 1100. In some implementations the adaptive CODEC 1100 is operable to determine and match the probabilities of bit errors at particular memory locations to the error correction capability and characteristics of an irregular LDPC code. To that end, as a non-limiting example, adaptive CODEC 1100 includes controller 1110, LDPC encoder 1123, LDPC decoder 1124, first MUX 1115, second MUX 1117, storage medium I/O 1128, adjustment module 1143, and error tracking module 1141.

Storage medium 1130 is coupled to storage medium I/O 1128 through data connections 903. In some implementations, storage medium 1130 includes any number of memory devices including, without limitation, non-volatile semiconductor memory devices, such as flash memory. For example, a flash memory device can be configured for enterprise storage suitable for applications such as cloud computing. Alternatively, a flash memory device can also be configured for relatively smaller-scale applications such as personal flash drives or hard-disk replacements for personal, laptop and tablet computers. As described above, storage mediums are often divided into a number of addressable and individually selectable blocks, such as selectable portion 1131. In some implementations, storage medium I/O 1128 includes read and write circuitry capable of applying read comparison signal values, such as voltages, to signal lines coupled to portions of the storage medium 1130.

First MUX 1115 provides an interface to a data processing system (or the like), from which data 1000 is received for encoding and storage in storage medium 1130. Second MUX 1117 (sometimes called a demultiplexer) selectively couples LDPC encoder 1123 to one of error location tracking module 1141 and storage medium I/O 1128. Controller 1110 is coupled to first and second MUXs 1115, 1117, and one or more of adjustment module 1143, error location tracking module 1141 and storage medium I/O 128 in order to coordinate the operation of these components.

Storage medium I/O 1128 is coupled to provide data and parity 1002 read from storage medium 1130 to LDPC decoder 1124. LDPC decoder 1124 is coupled to provide the data and parity 1002 to error location tracking module 1141. Error location tracking module 1141 is coupled to provide mapping data to adjustment module 1143. Adjustment module 143 is coupled to provide LDPC encoder 1123 with either adjustments to the LDPC generator matrix used by LDPC encoder to encode data, or a new LDPC generator matrix based on the mapping data. Adjustment module 143 is also coupled to provide LDPC decoder 1124 with either adjustments to the LDPC parity-check matrix used by LDPC decoder for decoding or a new LDPC parity-check matrix based on the mapping data.

During a write operation, first MUX 1115 receives data 1000 to be stored in storage medium 1130. First MUX 1115 passes data 1000 to LDPC encoder 1123, which encodes data

1000 to produce a codeword (i.e., data and parity 1001) using the adjustable generator matrix. The codeword is made available to storage medium I/O 1128, which transfers the codeword to storage medium 1130 in a manner dependent on the type of storage medium being utilized. During a read operation, for the same data, storage medium I/O 1128 accesses the portion of storage medium 1130 to read the stored codeword (i.e., data and parity 1002). Those skilled in the art will appreciate that the codeword written into storage medium 1130 by storage medium I/O 1128 may be different from the codeword stored by storage medium 1130 because of errors. In other words, data and parity 1001 may not match data and parity 1002. Accordingly, read data and parity 1002 is provided to LDPC decoder 1124 to decode using the adjustable parity-check matrix. As discussed below, LDPC decoder 1124 passes the read data and parity 1002 to error location tracking module 1141. LDPC decoder 1124 attempts to decode the read data and parity 1002 in order to correct errors in the data. When decoding is successful, corrected data 1006 is transmitted to the requesting device or system (e.g., a data processing system).

During successive write and read operations, error location data is accumulated as follows. LDPC decoder 1124 transmits uncorrected read data 1004 to first MUX 1115. First MUX 1115 transfers the uncorrected read data 1004 to LDPC encoder 1123 based on a control signal provided by controller 1110. LDPC encoder 1123 uses uncorrected read data 1004 to generate check-word (i.e., data'+parity") 1005, which includes uncorrected read data 1004 and parity newly generated from uncorrected read data 1004. Check-word 1005 is transmitted to error location tracking module 1141, which compares check-word 1005 to read data and parity 1002 to determine the number of errors in uncorrected read data 1004. The errors are then associated with the memory locations from which the data was read to create and/or update mapping information and/or error location statistics. In some implementations, mapping information and/or error location statistics are continually updated during successive write and read cycles in order to generate statistically significant results.

The mapping information is then transmitted to adjustment module 1143. In turn, adjustment module 1143 generates adjustments for an adjustable generator matrix (used by an encoder 1123) and an adjustable parity-check matrix (used by a decoder 1124) based on the mapping information and/or error location statistics. In some implementations, the adjustable parity-check matrix is irregular as discussed above. In some implementations, one or more error-prone storage locations are mapped to check bits of the adjustable parity-check matrix satisfying a threshold number of interconnections, where the error-prone locations have produced errors satisfying a threshold error characterization. In some implementations, the threshold error characterization is one of a minimum and a maximum. In some implementations, one or more non-error-prone storage locations are mapped to check bits of the adjustable parity-check matrix satisfying a threshold number of interconnections, where the non-error-prone locations have produced errors satisfying a threshold error characterization.

As shown in FIG. 12, in some implementations, H-matrix 1200 contains at least sub-matrices 1201 (sub-matrix A), 1202 (sub-matrix Z) and 1203 (sub-matrix B). FIG. 12 shows which portions of an H-matrix to adjust to map error location information to the code. The columns in H-matrix 1200 represent the variable bits (i.e., the data bits or message bits) and the rows of 1200 represent the check bits. In particular, the column and row weightings are adjusted, by adding 1's, to alter the connection complexity between the variable bits and the check bits (i.e., between the data and parity bits). The number of variable-check bit connections is increased by adding more 1's to the matrix. In some implementations, an increase in the overall number of variable-check bit connections decreases the decoding certainty of the associated data (i.e., variable) bit and/or check bit locations. Accordingly, in some implementations, memory locations with higher probabilities of bit errors are mapped to the less interconnected check bits of the code to enable relatively faster decoder convergence in a high defect environment.

Stated another way, in the aforementioned implementations (e.g., for use in high defect environments) a subset of the check bits, which can be called "low-connection" check bits, are connected to fewer memory locations than the remaining check bits on average, including memory locations with higher probabilities of bit errors (e.g., higher probabilities of bit errors than the average error probability for memory locations of the storage medium), which can be called "high-error probability memory locations," while the remaining check bits are connected to more memory locations than the low-connection memory locations and are, on average, also connected to fewer of the high-error probability memory locations than the low-connection check bits. In some implementations, the high-error probability memory locations meet predefined error probability criteria that are not satisfied by the remaining memory locations. In some implementations, the low-connection check bits each have less than a threshold number of connections, and the other check bits have more than the threshold number of connections on average. Furthermore, in some implementations, the threshold number of connections is associated with a convergence speed value of the decoder in a high defect environment.

In some implementations (e.g., for use in high defect environments), the low-connection check bits are associated with storage locations on initial and ending word lines of a storage medium block in the storage medium. Stated another way, the high-error probability memory locations include locations on words line at the beginning and end of the storage medium blocks. In some implementations, the low-connection check bits are associated with a set of storage locations located farthest from sense amplifiers of the storage medium. Stated another way, the high-error probability memory locations include locations farthest from the sense amplifiers of the storage medium.

In some implementations (e.g., for use in low defect environments), having fewer overall connections between the variable bits and check bits results in improved performance in a low defect environment because the decoder will typically converge faster. Faster decoder convergence occurs because more reliable information is quickly passed to those variable bits that are more susceptible to error. This faster and more reliable decoder convergence of the specific variable bits enables the message to be more efficiently decoded as the decoder iterates between variables and check bits. Accordingly, in some implementations, memory locations with higher probabilities of bit errors are mapped to the more interconnected check bits of the code to allow fast error detection in a low defect environment.

Stated another way, in the aforementioned implementations for use in low defect environments, a subset of the check bits, which can be called "high-connection" check bits, are connected to more memory locations than the remaining check bits on average, including memory locations with higher probabilities of bit errors (e.g., higher probabilities of bit errors than the average error probability for memory locations of the storage medium), which can be called "high-error probability memory locations," while the remaining check bits are connected to fewer memory locations than the high-connection memory locations and are, on average, also connected to fewer of the high-error probability memory locations than the high-connection check bits. In some implementations, the high-error probability memory locations meet predefined error probability criteria that are not satisfied by the remaining memory locations. In some implementations, high low-connection check bits each have more than a threshold number of connections, and the other check bits have fewer than the threshold number of connections on average. Furthermore, in some implementations, the threshold number of connections is associated with a convergence speed value of the decoder in a low defect environment.

In some implementations (e.g., for use in low defect environments), the high-connection check bits are associated with storage locations on initial and ending word lines of a storage medium block in the storage medium. Stated another way, the high-error probability memory locations include locations on words line at the beginning and end of the storage medium blocks. In some implementations, the high-connection check bits are associated with a set of storage locations located farthest from sense amplifiers of the storage medium. Stated another way, the high-error probability memory locations include locations farthest from the sense amplifiers of the storage medium.

As such, the process of adjusting the H-matrix to in accordance with error location information includes attempting to match the probability of the storage medium errors at specific memory locations to the capability of the LDPC decoder to find those errors.

In some implementations, there are differences between the defects found in the upper and lower page of a storage medium. This non-uniform behavior can be mapped to the entries of the H-matrix 1200 shown in FIG. 12.

Figure 13:
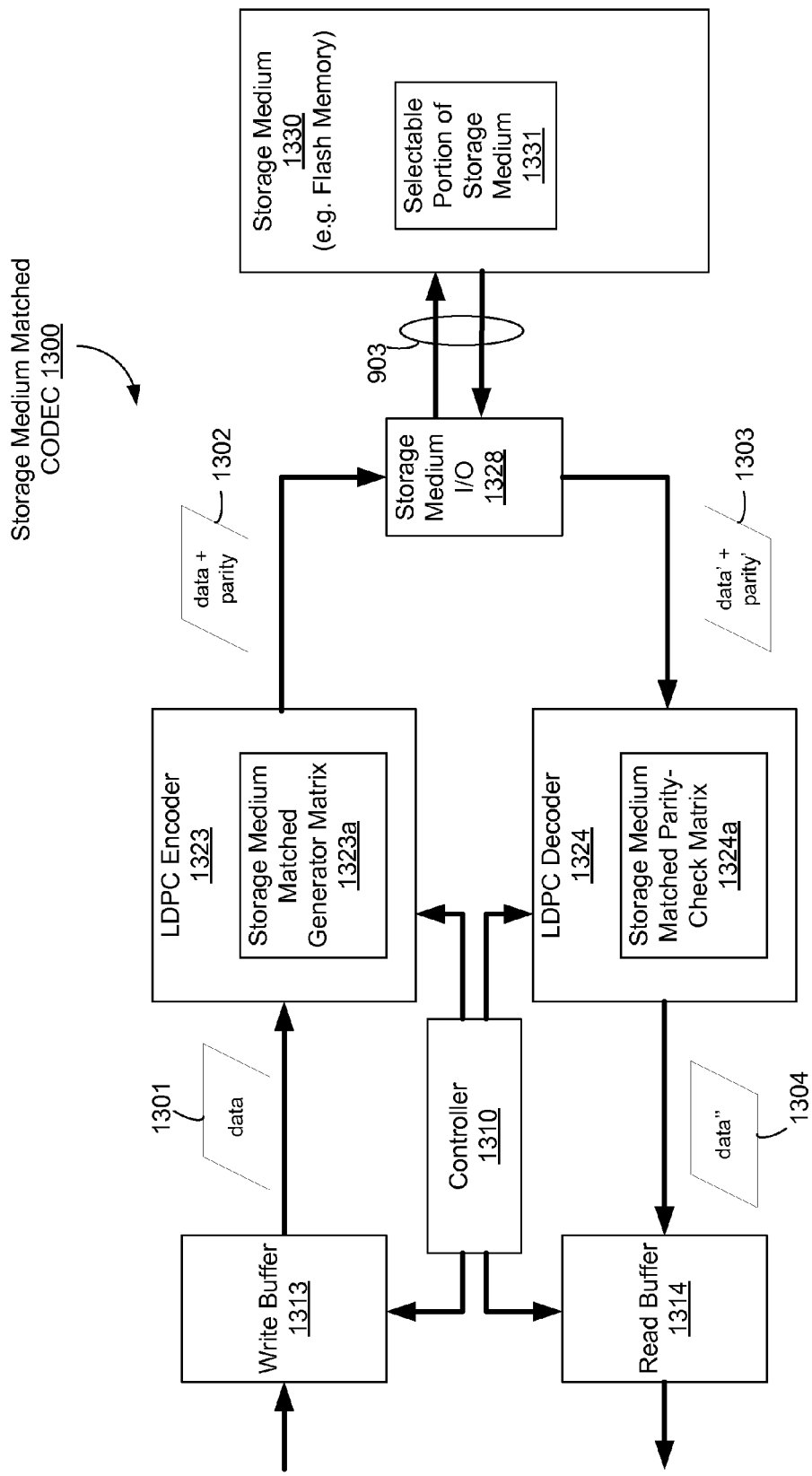
FIG. 13 is a schematic diagram of an implementation of an error control coding system that utilizes an error control code that has been matched to the error density location profile of a storage medium.

FIG. 13 is a schematic diagram of an implementation of an error control coding system that utilizes an error control code that corresponds to (e.g., has been matched to) the error density location profile of a storage medium, hereinafter referred to as storage medium matched CODEC 1300. In some implementations, the storage medium matched CODEC 1300 is operable to encode data, that will be written to a storage medium 1330, using an error control code generator matrix that matches the probabilities of bit errors at particular memory locations of storage medium 1330 to the error correction capability and characteristics of the error correction code defined by the generator matrix. Reciprocally, the storage medium matched CODEC 1300 is also operable to decode data and parity, read from storage medium 1330, using an error control code parity-check matrix complementary to the generator matrix, and thus, also relies on the matching between the probabilities of bit errors at particular memory locations and the error correction capability and characteristics of the error correction code.

To that end, as a non-limiting example, the storage medium matched CODEC 1300 includes controller 1310, LDPC encoder 1323, LDPC decoder 1324, write buffer 1313, read buffer 1314 and storage medium I/O 1328. The LDPC encoder 1323 includes and utilizes a storage medium matched generator matrix 1323*a*, and the LDPC decoder 1324 includes and utilizes a storage medium matched parity-check matrix 1324*a* that is complementary to (and thus corresponds to) the generator matrix 1323*a*. Those skilled in the art will appreciate from the present disclosure that the generator matrix 1323*a* and the parity-check matrix 1324*a*, individually and/or in combination, can be used to define a representation of a LDPC error control code. Furthermore, different instances of system 1300 using respective storage mediums having different error density location profiles use different generator matrices 1323*a* from each other and different parity-check matrices 1324*a* from each other.

Storage medium 1330 is coupled to storage medium I/O 1328 through data connections 903. In some implementations, storage medium 1330 includes any number of memory devices including, without limitation, non-volatile semiconductor memory devices, such as flash memory. For example, a flash memory device can be configured for enterprise storage suitable for applications such as cloud computing. Alternatively, a flash memory device can also be configured for relatively smaller-scale applications such as personal flash drives or hard-disk replacements for personal, laptop and tablet computers. As described above, storage mediums are often divided into a number of addressable and individually selectable blocks and/or zones, such as selectable portion 1331. In some implementations, storage medium I/O 1328 includes read and write circuitry capable of applying read comparison signal values, such as voltages, to signal lines coupled to portions of the storage medium 1330.

During a write operation, the write buffer 1313 receives data to be stored in storage medium 1330. A data block 1301 is passed from write buffer 1313 to LDPC encoder 1323. LDPC encoder 1323 encodes data block 1301 to produce a codeword (i.e., data and parity 1302) using storage medium matched generator matrix 1323*a*. Storage medium I/O 1328 writes the codeword to storage medium 1330 in a manner dependent on the type of storage medium being utilized. During a read operation, for the same data, storage medium I/O 1328 accesses the same portion of storage medium 1330 to read the stored codeword (i.e., data and parity 1303). Those skilled in the art will appreciate that the codeword written to storage medium 1330 by storage medium I/O 1328 may be different from the codeword stored by and/or read from storage medium 1330 because of errors. In other words, data and parity 1302 may not match data and parity 1303. Accordingly, read data and parity 1303 is provided to LDPC decoder 1224 to decode using storage medium matched parity-check matrix 1324*a*. When decoding is successful, corrected data 1304 is transmitted to the requesting device or system (e.g., a data processing system) via read buffer 1314.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An error control encoding system operable to produce a codeword from a data word, where the resulting codeword includes the data word and three or more parity segments produced using the data word, the system comprising:
   a first encoder to encode the data word in two or more first data segments in order to produce two or more first parity segments, wherein each of the two or more first data segments includes a respective sequential portion of the data word;
   a second encoder to encode the data word in one or more second data segments in order to produce a corresponding one or more second parity segments, wherein each of the one or more second data segments includes a respective sequential portion of the data word, and each of the one or more second data segments also includes a sequential portion of the data included in a plurality of the two or more first data segments; and
   a controller configured to provide respective data segments of the data word to the first encoder and second encoder in parallel, the respective data segments of the data word comprising the two or more first data segments of the data word provided to the first encoder for encoding, and the one or more second data segments of the data word provided to the second encoder for encoding.

2. The encoding system of claim 1, wherein the first encoder comprises a Bose Chaudhuri Hocquenghem (BCH) code encoder.

3. The encoding system of claim 1, wherein the second encoder comprises a low density parity check (LDPC) code encoder.

4. The encoding system of claim 1, wherein the first encoder is operable to encode the data word in two segments, which together include all of the data word.

5. The encoding system of claim 1, wherein the second encoder is operable to encode the data word as a whole.

6. The encoding system of claim 1, further comprising a portion of a memory controller operable to write the codeword into a storage medium.

7. The encoding system of claim 6, wherein the memory controller is a flash memory controller.

8. The encoding system of claim 6, wherein the memory controller comprises a storage medium interface operable to write the codeword into the storage medium.

9. The encoding system of claim 1, further comprising a third encoder to encode a plurality of data words, wherein the plurality of data words includes the data word encoded by the first encoder and second encoder.

10. The encoding system of claim 9, further comprising a buffer having capacity to store the data included the plurality of data words that can be encoded by the third encoder.

11. An error control decoding system operable to decode a codeword including a data word and three or more parity segments, the system comprising:
    a first decoder to decode the codeword by utilizing two or more first parity segments included in the codeword and two or more first data segments of the data word included the codeword, wherein:
    each of the two or more first parity segments is associated with a respective one of the two or more first data segments, and
    each of the two or more first data segments includes a respective sequential portion of the data word;
    a second decoder to decode the codeword by utilizing one or more second parity segments included in the codeword and one or more second data segments of the data word in the codeword, wherein:
    each of the one or more second parity segments is associated with a respective one of the one or more second data segments,
    each of the one or more second data segments includes a sequential portion of data included in a plurality of the two or more first data segments, and
    the second decoder utilizes a partial decoding result from the first decoder when available; and
    a controller to provide the two or more first data segments and the two or more first parity segments to the first decoder for decoding, and to provide the one or more second data segments from the data word to the second decoder for decoding.

12. The decoding system of claim 11, wherein the first decoder is operable to provide decoded data for each of the two or more first data segments that is decoded successfully independent of failing to successfully decode any of the other two or more first data segments.

13. The decoding system of claim 11, wherein the controller is further operable to provide decoded data from the first decoder, associated with each of the successfully decoded two or more first data segments, to the second decoder when at least one of the two or more first data segments is not successfully decoded.

14. The decoding system of claim 11, further comprising a soft information generation module to convert a decoding result produced by the first decoder into soft information, the soft information comprising at least a portion of the decoding result.

15. The decoding system of claim 14, wherein the soft information includes at least one of conditional probabilities associated with the codeword and log-likelihood ratios associated with the codeword.

16. The decoding system of claim 11, wherein the first decoder is operable to utilize a partial decoding result from the second decoder when available.

17. The decoding system of claim 16, wherein the partial decoding result from the second decoder includes soft information produced by the second decoder.

18. The decoding system of claim 11, further comprising:
a decoding verification module to evaluate decoding results of the first decoder and the second decoder, and signal the controller when one or more decoding flaws are detected in the decoding result of at least one of the first decoder and second decoder, and
wherein the controller is further operable to:
pass a partial decoding result from the first decoder to the second decoder when a first respective decoding flaw is detected in the decoding result of the first decoder, and
pass a partial decoding result from the second decoder to the first decoder when a second respective decoding flaw is detected in the decoding result of the second decoder.

19. The decoding system of claim 11, further comprising:
a decoding verification module to evaluate a decoding result produced by one of the first decoder and the second decoder, and signal the controller when a decoding flaw is detected in the decoding result, and
wherein the controller is further operable to:
pass a partial decoding result from the first decoder to the second decoder when the decoding flaw is detected in the decoding result of the first decoder, and
pass a partial decoding result from the second decoder to the first decoder when the decoding flaw is detected in the decoding result of the second decoder.

20. The decoding system of claim 11, further comprising:
a storage medium interface operable to read the codeword from a storage medium; and
a buffer to store the codeword read from the storage medium.

21. The decoding system of claim 20, wherein the storage medium is flash memory.

22. The decoding system of claim 11, further comprising a third decoder to decode a plurality of codewords, wherein the plurality of codewords includes at least the data word of the codeword decoded by the first decoder and second decoder.

23. The decoding system of claim 11, wherein the first decoder comprises a Bose Chaudhuri Hocquenghem (BCH) code decoder.

24. The decoding system of claim 11, wherein the second decoder comprises a low density parity check (LDPC) code decoder.

25. The decoding system of claim 11 comprising a portion of a memory controller.

26. The decoding system of claim 11, further operable to select one of the first decoder or the second decoder to start decoding the codeword.

27. The decoding system of claims 26, further comprising an error estimation module comprising:
an encoder, corresponding to the second decoder, to produce one or more third parity segments from the one or more second data segments in the codeword;
a comparator module to estimate the number of errors in the data word of the codeword by evaluating the one or more second parity segments and the one or more third parity segments; and
a decision module to select which of the first decoder and second decoder to start decoding the codeword with, wherein the selection is at least based on the estimated number of errors.

28. An error control encoding system operable to produce a codeword from a data word, where the resulting codeword includes the data word and four or more parity segments produced using the data word, the system comprising:
a first encoder to encode the data word in two or more first data segments in order to produce two or more first parity segments, wherein each of the two or more first data segments includes a respective sequential portion of the data word;
a second encoder to encode the data word in two or more second data segments in order to produce a corresponding two or more second parity segments, wherein each of the two or more second data segments includes a respective sequential portion of the data word, and each of the two or more second data segments also includes a sequential portion of the data included in a plurality of the two or more first data segments; and
a controller configured to provide the two or more first data segments of the data word to the first encoder for encoding, and to provide the two or more second data segments of the data word to the second encoder for encoding.

29. The error control encoding system 28, wherein the first encoder is configured to encode the data word in three of more first data segments in order to produce three or more first parity segments, and the second encoder is configured to encode the data word in two of more second data segments in order to produce two or more second parity segments.

* * * * *

UNITED STATES PATENT AND TRADEMARK OFFICE
CERTIFICATE OF CORRECTION

PATENT NO. : 9,048,876 B2
APPLICATION NO. : 13/679963
DATED : June 2, 2015
INVENTOR(S) : Frayer et al.

It is certified that error appears in the above-identified patent and that said Letters Patent is hereby corrected as shown below:

In the claims

Claim 1, column 27, line 32, delete "in two or more first data segments" and insert -- wherein the first encoder is configured to encode two or more first data segments of the data word --;

Claim 1, column 27, line 35, delete "respective" and insert -- distinct --;

Claim 1, column 27, lines 37-44, delete "a second encoder to encode the data word in one or more second data segments in order to produce a corresponding one or more second parity segments, wherein each of the one or more second data segments includes a respective sequential portion of the data word, and each of the one or more second data segments also includes a sequential portion of the data included in a plurality of the two or more first data segments; and" and insert -- a second encoder to encode, wherein the second encoder is configured to encode one or more second data segments of the data word in order to produce a corresponding one or more second parity segments, wherein the second encoder operates independently of the first encoder to encode the data word, each of the one or more second data segments includes a sequential portion of the data in a plurality of the two or more first data segments; and --;

Claim 1, column 27, line 51, delete "encoding." and insert -- encoding independently of the encoding of the data word by the first encoder. --;

Claim 5, column 27, line 61, delete "claim 1" and insert -- claim 4 --;

Claim 5, column 27, line 62, delete "as a whole." and insert -- as a whole while the first encoder encodes the data word. --;

Claim 11, column 28, line 17, delete "included the" and insert -- included in the --;

Signed and Sealed this
Twenty-fourth Day of November, 2015

Michelle K. Lee
*Director of the United States Patent and Trademark Office*

CERTIFICATE OF CORRECTION (continued)
U.S. Pat. No. 9,048,876 B2

Claim 11, column 28, line 32, delete "portion of data included in" and insert -- portion of the data in --;

Claim 11, column 28, line 35, delete "when" and insert -- in accordance with a determination that a partial decoding result from the first decoder is --;

Claim 11, column 28, line 41, delete "decoding." and insert -- ; wherein the controller is configured to pass a partial decoding result from the second decoder to the first decoder in accordance with a determination that a decoding result of the second decoder contains a decoding flaw. --;

Claim 13, column 28, line 50, delete "when" and insert -- in accordance with a determination that --;

Claim 16, column 28, lines 62-64, delete "16. The decoding system of claim 11, wherein the first decoder is operable to utilize a partial decoding result from the second decoder when available.";

Claim 17, column 28, line 65, delete "claim 16" and insert -- claim 11 --;

Claim 18, column 29, line 4, delete "when" and insert -- in accordance with a determination that --;

Claim 18, column 29, line 9, delete "when" and insert -- in accordance with a determination that --;

Claim 18, column 29, line 12, delete "when" and insert -- in accordance with a determination that --;

Claim 19, column 29, line 17, delete "when" and insert -- in accordance with a determination that --;

Claim 19, column 29, line 21, delete "when" and insert -- in accordance with a determination that --;

Claim 19, column 29, line 24, delete "when" and insert -- in accordance with a determination that --;

Claim 28, column 30, line 27, delete "wherein each of" and insert -- wherein the second encoder operates independently of and in parallel with the first encoder to encode the data word, each of --;

Claim 28, column 30, lines 36-37, delete "for encoding." and insert -- for encoding independently of the encoding of the data word by the first encoder. --.